United States Patent
Kwon et al.

(10) Patent No.: US 7,358,669 B2
(45) Date of Patent: Apr. 15, 2008

(54) PLASMA DISPLAY PANEL HAVING ELECTROMAGNETIC WAVE SHIELDING LAYER

(75) Inventors: Jae-Ik Kwon, Asan-si (KR); Won-Ju Yi, Suwon-si (KR); Kyoung-Doo Kang, Seoul (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 186 days.

(21) Appl. No.: 11/057,241

(22) Filed: Feb. 15, 2005

(65) Prior Publication Data
US 2005/0212424 A1    Sep. 29, 2005

(30) Foreign Application Priority Data
Mar. 25, 2004    (KR) ...................... 10-2004-0020285

(51) Int. Cl.
*H01J 17/49* (2006.01)
(52) U.S. Cl. ...................... 313/582; 313/586; 313/587; 313/112; 313/580
(58) Field of Classification Search ...................... None
See application file for complete search history.

(56) References Cited

U.S. PATENT DOCUMENTS

| | | |
|---|---|---|
| 5,541,618 A | 7/1996 | Shinoda |
| 5,661,500 A | 8/1997 | Shinoda et al. |
| 5,663,741 A | 9/1997 | Kanazawa |
| 5,674,553 A | 10/1997 | Shinoda et al. |
| 5,724,054 A | 3/1998 | Shinoda |
| 5,786,794 A | 7/1998 | Kishi et al. |
| 5,952,782 A | 9/1999 | Nanto |
| 6,034,474 A * | 3/2000 | Ueoka et al. ............... 313/584 |

(Continued)

FOREIGN PATENT DOCUMENTS

JP        02-148645        6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Ashok Patel
(74) *Attorney, Agent, or Firm*—Robert E. Bushnell, Esq.

(57) ABSTRACT

A plasma display panel (PDP) which can reduce the cost and time of manufacturing a plasma display device, and which can improve heat transfer efficiency of a plasma display device, comprises: a transparent front substrate; a rear substrate disposed parallel to the front substrate; an electromagnetic wave shielding layer fixed on the front substrate; a plurality of discharge cells defined by barrier ribs disposed between the front substrate and the rear substrate; a plurality of address electrodes extending over the discharge cells and disposed in a given direction; a rear dielectric layer covering the address electrodes; a plurality of fluorescent layers disposed in the discharge cells; a plurality of sustaining electrode pairs extending in a direction which crosses the given direction of the address electrodes; a front dielectric layer covering the sustaining electrode pairs; and a discharge gas filling the discharge cells.

20 Claims, 16 Drawing Sheets

U.S. PATENT DOCUMENTS

| | | |
|---|---|---|
| RE37,444 E | 11/2001 | Kanazawa |
| 6,532,120 B1 * | 3/2003 | Harada et al. .............. 359/885 |
| 6,630,916 B1 | 10/2003 | Shinoda |
| 6,707,436 B2 | 3/2004 | Setoguchi et al. |
| 7,088,044 B2 * | 8/2006 | Yoo ........................... 313/587 |

FOREIGN PATENT DOCUMENTS

| | | |
|---|---|---|
| JP | 08-045433 | 2/1996 |
| JP | 2845183 | 10/1998 |
| JP | 11-066933 | 3/1999 |
| JP | 2917279 | 4/1999 |
| JP | 11-248929 | 9/1999 |
| JP | 2000-156182 | 6/2000 |
| JP | 2001-043804 | 2/2001 |
| JP | 2001-325888 | 11/2001 |
| JP | 2003-007218 | 1/2003 |
| KR | 10-2003-0007056 | 1/2003 |

* cited by examiner

PLASMA DISPLAY PANEL HAVING ELECTROMAGNETIC WAVE SHIELDING LAYER

CLAIM OF PRIORITY

This application makes reference to, incorporates the same herein, and claims all benefits accruing under 35 U.S.C. §119 from an application for PLASMA DISPLAY PANEL COMPRISING A EMI SHIELDING LAYER earlier filed in the Korean Intellectual Property Office on 25 Mar. 2004 and there duly assigned Serial No. 2004-20285.

BACKGROUND OF THE INVENTION

1. Technical Field

The present invention generally relates to a plasma display panel (PDP) which includes an electromagnetic wave shielding layer.

2. Related Art

A plasma display device comprises a front case that includes a perimeter unit defining a window, an electromagnetic wave shielding filter that covers the window, a conductive filter holder which presses the electromagnetic wave shielding filter against the perimeter unit of the front case and which is fixed to a coupling boss of the front case, a plasma display panel (PDP) which includes a front panel and a rear panel and which is disposed on a rear of the conductive filter holder, a chassis that supports the PDP, connecting cables which connect a circuit unit that drives the PDP and is disposed on a rear of the chassis and the PDP, and a rear case which is coupled to the front case and which is disposed on a rear of the chassis. A thermal conductive sheet is interposed between the PDP and the chassis.

The front panel comprises a front substrate, a plurality of sustaining electrode pairs that include Y electrodes and X electrodes formed on a rear surface of the front substrate, a front dielectric layer that covers the sustaining electrode pairs, and a protection layer that covers the front dielectric layer. Each of the Y electrodes and the X electrodes includes a transparent electrode formed of indium tin oxide (ITO) and bus electrodes formed of a metal having high conductivity. The bus electrodes are connected to the connecting cables disposed on left and right sides of the PDP.

The rear panel comprises a rear substrate, a plurality of address electrodes which are formed to cross the sustaining electrode pairs and which are disposed on a front surface of the rear substrate, a rear dielectric layer that covers the address electrodes, a plurality of barrier ribs which define the discharge cells and which are disposed on the rear dielectric layer, and a plurality of fluorescent layers disposed in the discharge cells. The address electrodes are connected to connecting cables disposed on upper and lower parts of the PDP.

An electromagnetic wave shielding filter comprises a central unit that faces the window of the front case and a perimeter unit that surrounds the central unit. A conductive mesh layer for shielding electromagnetic waves is formed on the central unit. A metal layer for electrically connecting the conductive mesh layer to the conductive filter holder is formed on the perimeter unit. The conductive mesh layer is formed on a transparent substrate and is covered by a planarizing layer. A near infrared ray shielding layer is formed on the planarizing layer. The energy of the electromagnetic wave trapped by the conductive mesh layer is transmitted to the far side of the PDP or is dissipated to the outside of the PDP via the metal layer and the conductive filter holder.

However, in the case of a PDP having the above structure, there is a drawback in that the manufacturing cost is increased because the electromagnetic wave shielding filter and the conductive filter holder can only be coupled to the front case after being manufactured separately.

Also, a predetermined space is formed between the electromagnetic wave shielding filter and the PDP due to the thickness of the conductive filter holder, and a portion of the heat generated in the PDP due to discharge is transferred to this space.

However, the air in this space is not circulated because the space is surrounded by the conductive filter holder. An air pathway can be formed by modifying the shape of the conductive filter holder, but constructing an air pathway large enough to circulate the air is difficult. Even though a sufficiently large enough pathway is secured, the efficient dissipation of heat by air convection in the space cannot be achieved because there is tremendous air friction due to a narrow gap, that is, the thickness of the conductive filter holder, between the electromagnetic wave shielding filter and the PDP.

SUMMARY OF THE INVENTION

The present invention provides a plasma display panel (PDP) having reduced manufacturing cost and reduced manufacturing time, as well as improved heat radiation efficiency.

According to an aspect of the present invention, there is provided a plasma display panel (PDP) comprising: a transparent front substrate; a rear substrate disposed parallel to the front substrate; an electromagnetic wave shielding layer fixed to the front substrate; a plurality of discharge cells defined by barrier ribs disposed between the front substrate and the rear substrate; a plurality of address electrodes extending over the discharge cells and disposed in a given direction; a rear dielectric layer that covers the address electrodes; a plurality of fluorescent layers disposed in the discharge cells; a plurality of sustaining electrode pairs extending in a direction which crosses the given direction of the address electrodes; a front dielectric layer that covers the sustaining electrode pairs; and a discharge gas filled in the discharge cells.

The electromagnetic wave shielding layer can be formed on either a front surface or a rear surface of the front substrate, and can be attached to the front surface or the rear surface of the front substrate using a dual-sided adhesive film.

A near infrared ray shielding layer may be fixed to the front substrate, and the electromagnetic wave shielding layer can be covered by the near infrared ray shielding layer or a planarizing layer.

The address electrodes are disposed between the rear substrate and the rear dielectric layer, the barrier ribs are disposed on the rear dielectric layer, the sustaining electrode pairs are disposed between the front substrate and the front dielectric layer, and the front dielectric layer is covered by the protection layer.

According to another aspect of the present invention, there is provided a PDP comprising: a transparent front substrate; a rear substrate disposed parallel to the front substrate; an electromagnetic wave shielding layer fixed on the front substrate; a plurality of front barrier ribs defining discharge cells, formed of a dielectric, and disposed between the front substrate and the rear substrate; a plurality of front discharge electrodes and rear discharge electrodes disposed on the front barrier ribs so as to surround the discharge cells; a plurality of rear barrier ribs disposed between the front barrier ribs and the rear substrate; a plurality of fluorescent layers disposed in a space defined by the rear barrier ribs, and a discharge gas filled in the discharge cells.

The electromagnetic wave shielding layer can be formed on a front surface or a rear surface of the front substrate, or can be fixed to the front surface or rear surface of the front substrate by attachment thereto using a dual-sided adhesive film.

The electromagnetic wave shielding layer can be covered by a planarizing layer on the near infrared ray shielding layer, which may be fixed to the front substrate.

The front discharge electrodes and the rear discharge electrodes extend in a direction parallel to each other, and, in this case, the PDP further comprises address electrodes extending so as to cross the front discharge electrodes and the rear discharge electrodes.

A side surface of the front barrier ribs is covered by the protection film, the address electrodes are disposed between the rear substrate and the fluorescent layers, and the dielectric layer is disposed between the address electrodes and the fluorescent layers.

The front barrier ribs and the rear barrier ribs can be formed in one body.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings in which exemplary embodiments of the invention are shown.

Figure 1:
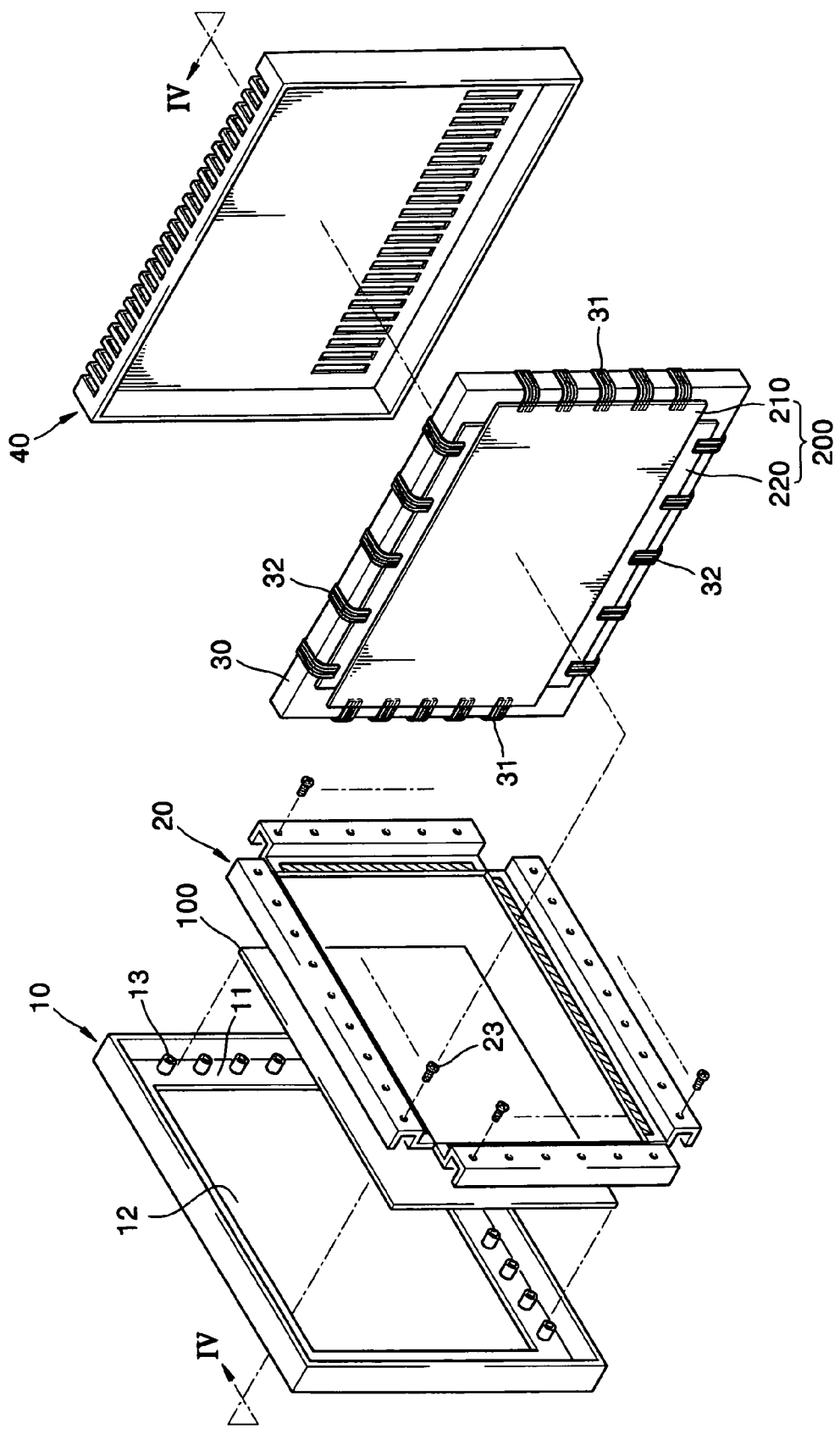
FIG. 1 is an exploded perspective view of a plasma display device.

FIG. 1 is an exploded perspective view of a plasma display device.

Figure 4:
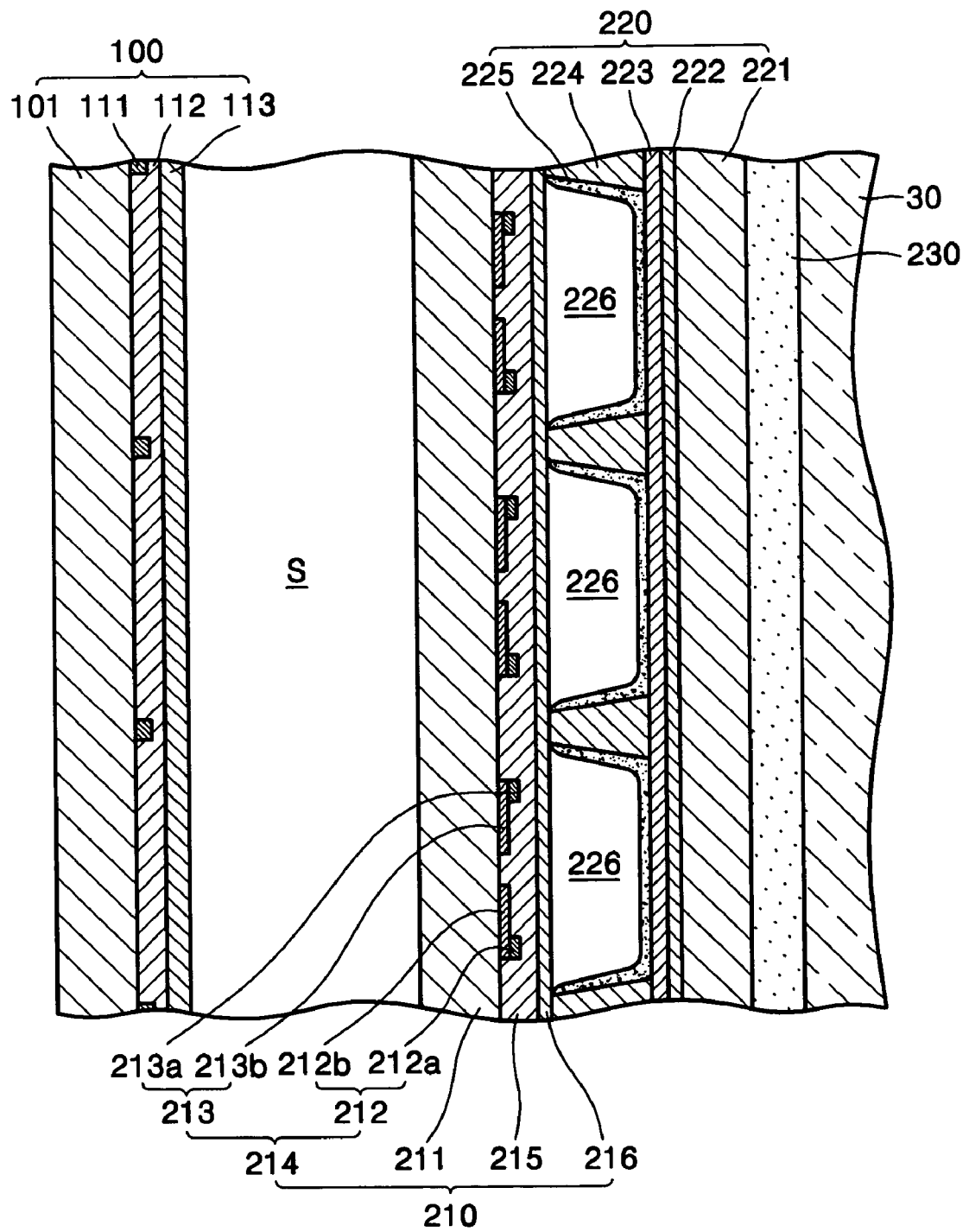
FIG. 4 is a cross-sectional view taken along line IV-IV of FIG. 1.

Referring to FIG. 1, a plasma display device comprises a front case 10 which includes a perimeter unit 11 defining a window 12, an electromagnetic wave shielding filter 100 which covers the window 12, a conductive filter holder 20 which presses the electromagnetic wave shielding filter 100 against the perimeter unit 11 of the front case 10 and which is fixed to a coupling boss 13 of the front case 10, a plasma display panel (PDP) 200 which includes a front panel 210 and a rear panel 220 and which is disposed on a rear of the conductive filter holder 20, a chassis 30 that supports the PDP 200, connecting cables 31 and 32 which connect a circuit unit (not shown) that drives the PDP 200 and is disposed on a rear of the chassis 30 and the PDP 200, and a rear case 40 which is coupled to the front case 10 and which is disposed on a rear of the chassis 30. As depicted in FIG. 4, a thermal conductive sheet 230 is interposed between the PDP 200 and the chassis 30.

Figure 2:
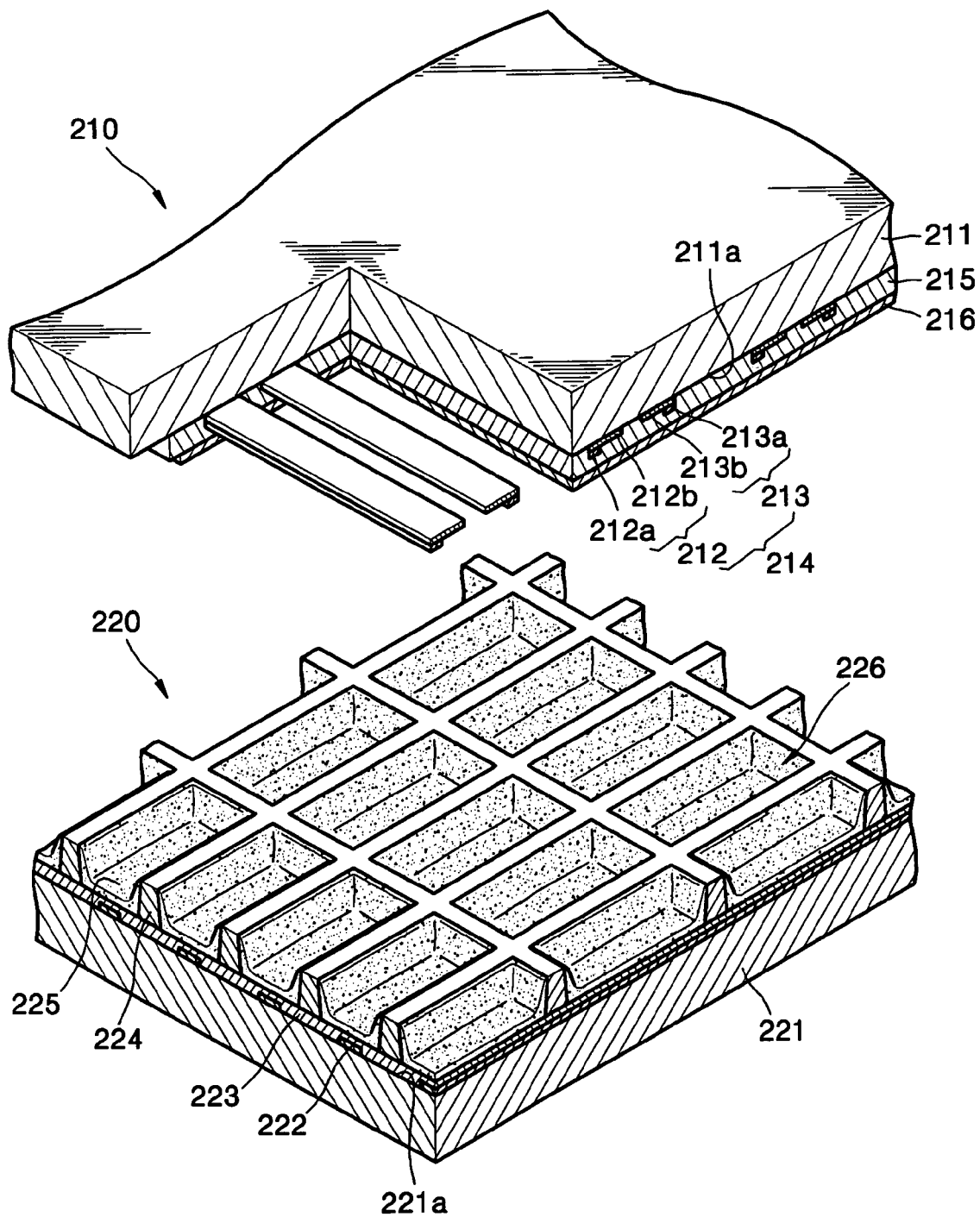
FIG. 2 is a partially cutaway perspective view of a PDP.

FIG. 2 is a partially cutaway perspective view of a PDP. Referring to FIG. 2, the structure of the PDP 200, in which the front panel 210 and the rear panel 220 are included, is depicted.

The front panel 210 comprises a front substrate 211, a plurality of sustaining electrode pairs 214 that include Y electrodes 212 and X electrodes 213 formed on a rear surface 211a of the front substrate 211, a front dielectric layer 215 that covers the sustaining electrode pairs 214, and a protection layer 216 that covers the front dielectric layer 215. Each of the Y electrodes 212 and the X electrodes 213 includes a transparent electrode 212b and 213b formed of indium tin oxide (ITO) and bus electrodes 212a and 213a formed of a metal having high conductivity. The bus electrodes 212a and 213a are connected to the connecting cables 31 disposed on left and right hand sides of the PDP 200.

The rear panel 220 comprises a rear substrate 221, a plurality of address electrodes 222 formed to cross the sustaining electrode pairs 214 and disposed on a front surface 221a of the rear substrate 221, a rear dielectric layer 223 that covers the address electrodes 222, a plurality of barrier ribs 224 which define the discharge cells 226 and which are disposed on the rear dielectric layer 223, and a plurality of fluorescent layers 225 disposed in the discharge cells 226. The address electrodes 222 are connected to connecting cables 32 disposed on upper and lower parts of the PDP 200.

Figure 3:
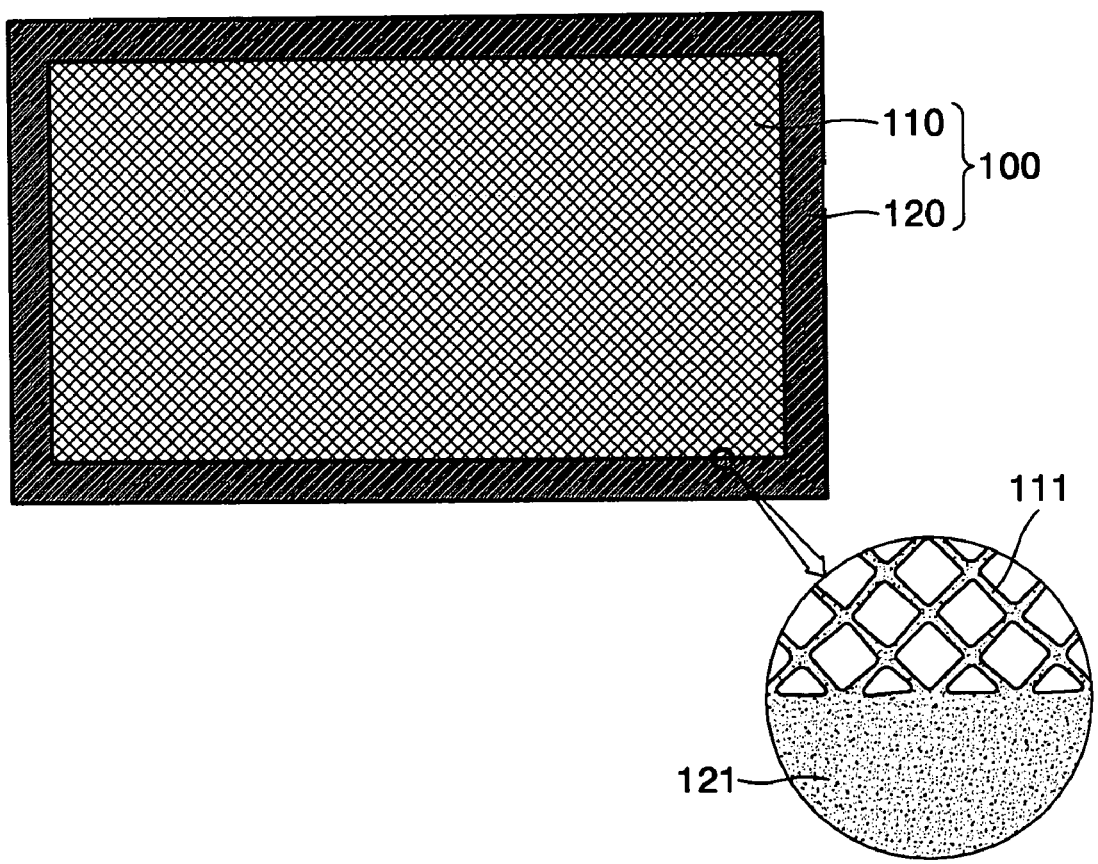
FIG. 3 is a plan view of an electromagnetic wave shielding filter applied to a plasma display device.

FIG. 3 is a plan view of an electromagnetic wave shielding filter applied to a plasma display device. The electromagnetic wave shielding filter 100 comprises a central unit 110 that faces the window 12 of the front case 10 and the perimeter unit 11 that surrounds the central unit 110. A conductive mesh layer 111 for shielding electromagnetic waves is formed on the central unit 110. A metal layer 121 for electrically connecting the conductive mesh layer 111 to the conductive filter holder 20 is formed on the perimeter unit 120. As depicted in FIG. 4, the conductive mesh layer 111 is formed on a transparent substrate 101 and is covered by a planarizing layer 112. A near infrared ray shielding layer 113 is formed on the planarizing layer 112. The energy of the electromagnetic wave trapped by the conductive mesh layer 111 is transmitted to the far side of the PDP 200 or is dissipated to the outside of the PDP 200 via the metal layer 121 and the conductive filter holder 20.

However, in the PDP 200 having the above structure, there is a drawback in that the manufacturing cost is increased because the electromagnetic wave shielding filter 100 and the conductive filter holder 20 can only coupled to the front case 10 after being manufactured separately.

Also, a predetermined space S is formed between the electromagnetic wave shielding filter 100 and the PDP 200 due to the thickness of the conductive filter holder 20, and a portion of heat generated in the PDP 200 due to discharge is transferred to this space S.

However, the air in this space S is not circulated because the space S is surrounded by the conductive filter holder 20. An air pathway can be formed by modifying the shape of the conductive filter holder 20, but constructing an air pathway large enough to circulate the air is difficult. Even if a sufficiently large pathway is secured, the efficient dissipation of heat by air convection in the space S cannot be achieved because there is tremendous air friction due to a narrow gap, that is, the thickness of the conductive filter holder 20, between the electromagnetic wave shielding filter 100 and the PDP 200.

Figure 5:
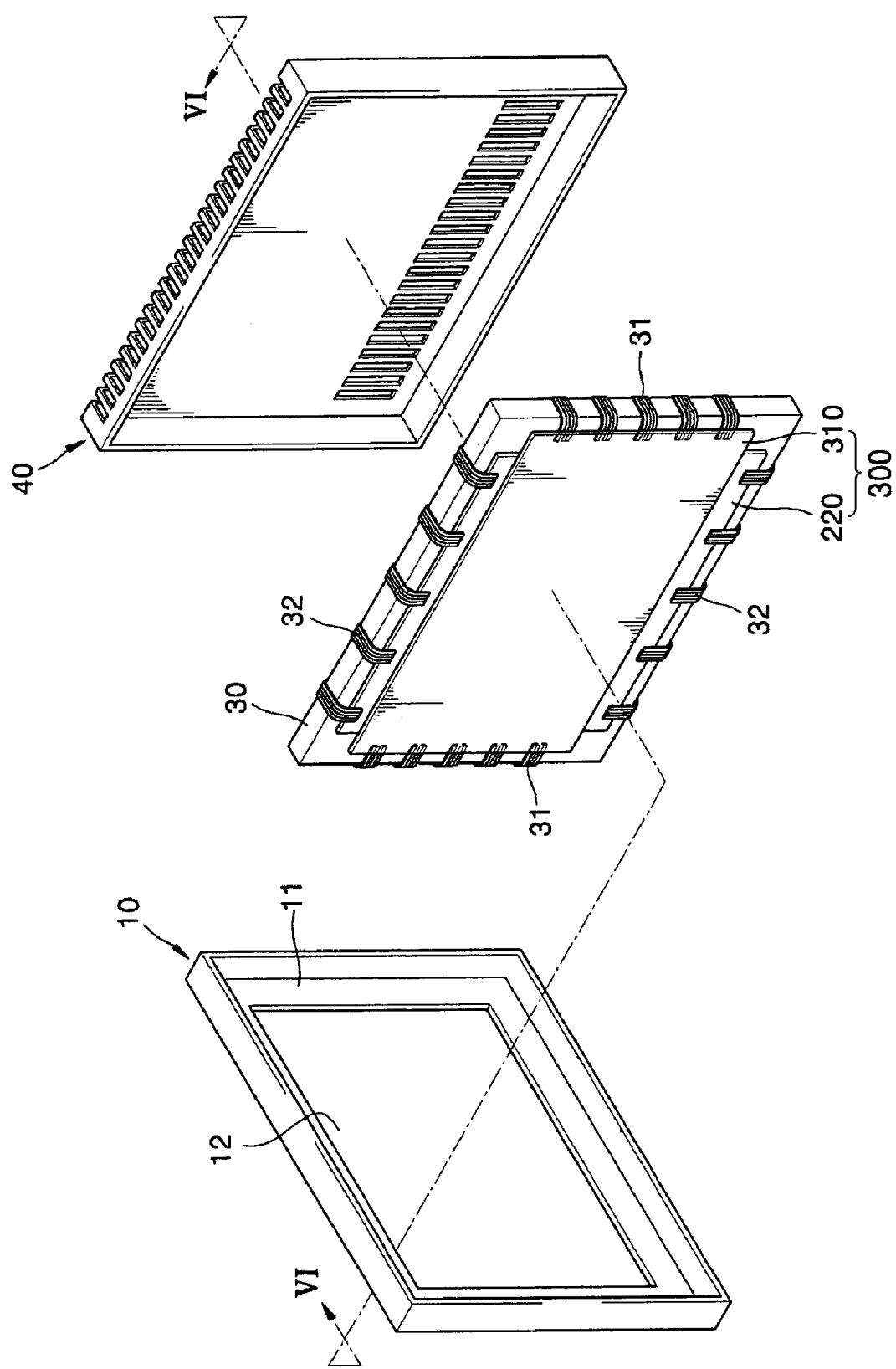
FIG. 5 is an exploded perspective view of a plasma display device having a PDP according to a first embodiment of the present invention.
Figure 6:
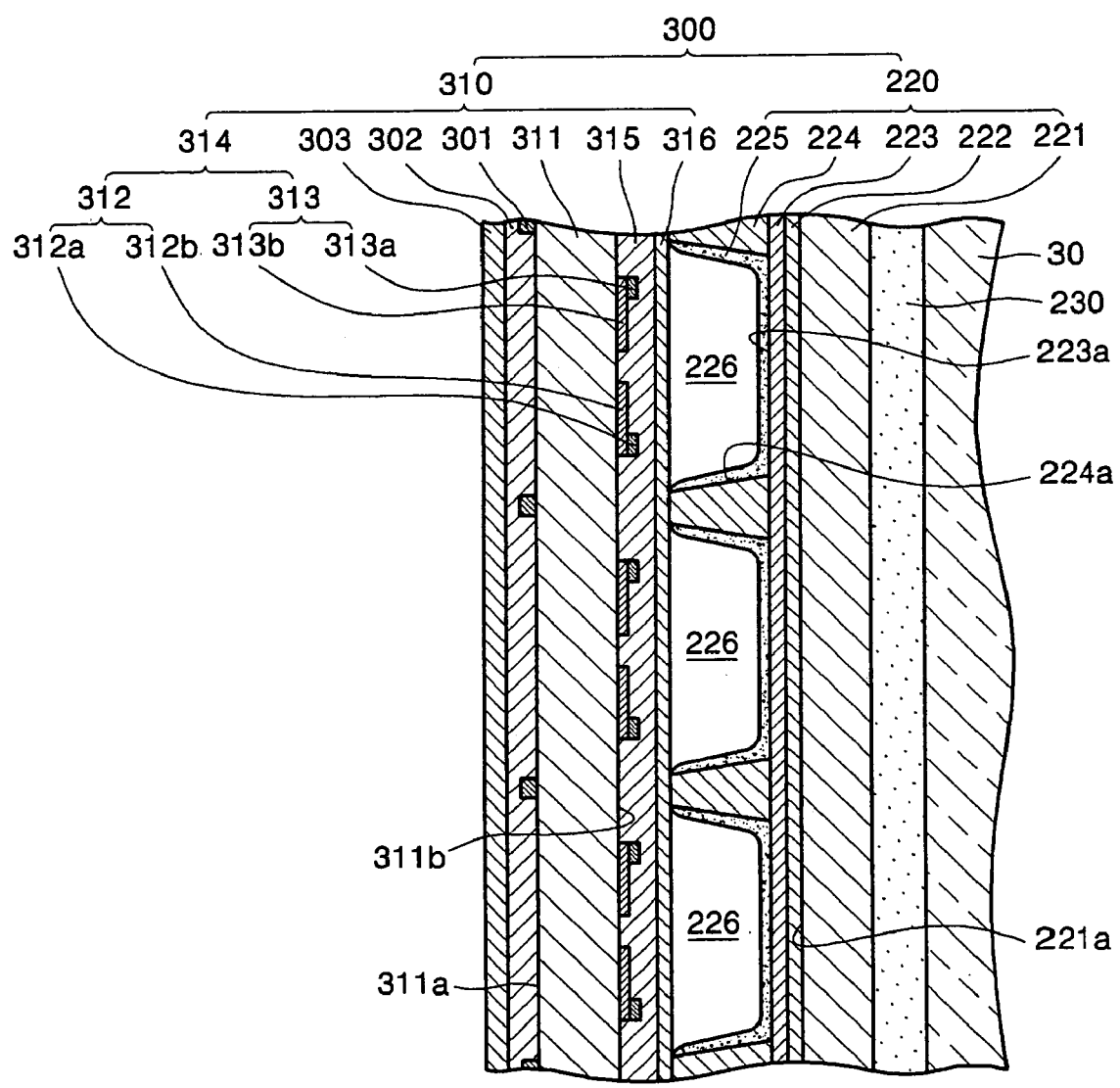
FIG. 6 is a cross-sectional view taken along line VI-VI of FIG. 5.

FIG. 5 is an exploded perspective view of a plasma display device having a PDP according to a first embodiment of the present invention, and FIG. 6 is a cross-sectional view taken along line VI-VI of FIG. 5.

Referring to FIG. 5, a PDP 300 comprises a front case 10 that includes a perimeter unit 11 defining a window 12, a plasma display panel (PDP) 300 which includes a front panel 310 and a rear panel 220 and which is disposed on a rear of the front case 10, a chassis 30 that supports the PDP 300, connecting cables 31 and 32 which connect a circuit unit (not shown) that drives the PDP 300 and is disposed on a rear of the chassis 30 and the PDP 300, and a rear case 40 coupled to the front case 10 and disposed on a rear of the chassis 30. As depicted in FIG. 6, a thermal conductive sheet 230 is interposed between the PDP 300 and the chassis 30.

It can be seen, by comparing FIG. 1 and FIG. 5, that the plasma display device having the PDP 300 according to a first embodiment does not include an electromagnetic wave shielding filter 100 separately manufactured, and a conductive filter holder 20 that presses the front case 10 against the perimeter unit 11. Therefore, the manufacturing cost of the electromagnetic wave shielding filter 100 and the conductive filter holder 20, and the cost of coupling them to the front case 10, can be reduced.

However, the PDP 300 includes a means for shielding the electromagnetic waves since the electromagnetic waves generated by the operation of the PDP 300 must be shielded. Hereinafter, the PDP 300 according to the present embodiment will now be described.

The PDP 300 depicted in FIG. 6 includes a front panel 310 and a rear panel 220.

The front panel 310 comprises a front substrate 311, a plurality of sustaining electrode pairs 314 extending over a row of discharge cells 226 and disposed on a rear surface 311b of the front substrate 311, a front dielectric layer 315 that covers the sustaining electrode pairs 314, and an electromagnetic wave shielding layer 301 fixed to front substrate 311 of the front substrate 311. When necessary, the PDP 300 can further comprise a protection film 316 that covers the front dielectric layer 315, a planarizing layer 302 that covers the electromagnetic wave shielding layer 301, and a near infrared ray shielding layer 303 formed on the planarizing layer 302. The front panel 310 depicted in FIG. 6 has a structure similar to that of the front panel 210 depicted in FIG. 2, but there is a difference in that the front panel 310 includes the electromagnetic wave shielding layer 301.

The rear panel 220 comprises a rear substrate 221 disposed parallel to the front substrate 311, a plurality of address electrodes 222 extending so as to cross the sustaining electrode pairs 314 and disposed on front surface 221a of the rear substrate 221, a rear dielectric layer 223 that covers the address electrodes 222, a plurality of barrier ribs 224 defining the discharge cells 226 and interposed between the front substrate 311 and the rear substrate 221 (more specifically, on the rear dielectric layer 223), and a plurality of fluorescent layers 225 disposed in the discharge cells 226. A discharge gas is filled in the discharge cells 226. The rear panel 220 depicted in FIG. 6 has a structure at least similar to that of the rear panel 220 depicted in FIG. 2.

The front substrate 311 and the rear substrate 221 are formed of glass, and the front substrate 311 preferably has high light permeability.

The address electrodes 222, extending over a row of the discharge cells 226 and disposed on a front surface 221a of the rear substrate 221, are formed of a metal having high electrical conductivity, such as Al. The address electrodes 222 are used for address discharge with Y electrodes 312. Address discharge is a discharge required for selecting discharge cells 226 for emitting light, and a sustaining discharge, which will be described later, can occur in the discharge cells 226 where the discharge has occurred.

The address electrodes 222 are covered by the rear dielectric layer 223, and the rear dielectric layer 223 protects the address electrodes 222 from damage by absorbing the impact of charged particles during address discharge. The rear dielectric layer 223 is formed of a dielectric, such as $PbO$, $B_2O_3$, or $SiO_2$, that can induce charged particles.

A plurality of barrier ribs 224 that define the discharge cells 226 are formed between the front substrate 311 and the rear substrate 221. The barrier ribs 224 provide a discharge space between the front substrate 311 and the rear substrate 221, prevent cross-talk between the adjacent discharge cells 226, and increase the surface area of the fluorescent layer 225. When necessary, the barrier ribs 224 can include a filler, such as $ZrO_2$, $TiO_2$, and $Al_2O_3$, and a pigment, such as Cr, Cu, Co, Fe, or $TiO_2$.

In FIG. 6, the barrier ribs 224 are depicted on the rear dielectric layer 223, but the present invention is not limited thereto. For example, a reflection layer for reflecting light emitted from the fluorescent layers 225 toward the front substrate 311 can be interposed between the barrier ribs 224 and the rear dielectric layer 223. Also, according to the present embodiment, the barrier ribs 224 have a lattice shape as depicted in FIG. 2, but are not limited thereto.

The fluorescent layer 225 is disposed in the discharge cells 226. In FIG. 6, the fluorescent layer 225 is depicted on a side surface 224a of the barrier ribs 224 and on a front surface 223a of the rear dielectric layer 223, but the location of the fluorescent layer 225 is not limited thereto. The fluorescent layer 225 includes a fluorescent material that emits light by absorbing ultraviolet rays generated from the discharge gas during the sustaining discharge. A fluorescent material that emits red light is $Y(V,P)O_4$:Eu, fluorescent materials that emit green light are $Zn_2SiO_4$:Mn, $YBO_3$:Tb, and a fluorescent material that emits blue light is BAM:Eu.

The sustaining electrode pairs 314 extend in a direction so as to cross the address electrodes 222 extending over a row of the discharge cells 226. The sustaining electrode pairs 314 include a pair of sustaining electrodes 312 and 313 that cause sustaining discharges, and the sustaining electrode pairs 314 are arranged parallel to each other with a predetermined distance therebetween. One of the sustaining electrodes 312 and 313 is a Y electrode 312 and the other is an X electrode 313. The sustaining discharge occurs due to the potential difference between the X electrodes 313 and the Y electrodes 312.

Each of the X electrode 313 and the Y electrode 312 conventionally includes transparent electrodes 313b and 312b, respectively, and bus electrodes 313a and 312a, respectively. However, in some cases, the X electrode 313 and the Y electrode 312 can be structured with bus electrodes 313a and 312a, respectively, only and without the transparent electrodes 313b and 312b, respectively.

The transparent electrodes 312b and 313b are formed of a transparent conductive material, such as ITO, which does not interrupt light emissions from a fluorescent material toward the front substrate 311. However, when the sustaining electrode pairs 314 are formed of only transparent electrodes 312b and 313b, the voltage drop in the extending direction of the transparent electrodes 312b and 313b is large since the transparent conductive material, such as ITO, has a high resistance. Accordingly, the power consumption for driving the PDP increases, and the response time for displaying an image is delayed. To solve this problem, bus electrodes 312a and 313a formed of a metal having high electrical conductivity, such as Ag, are disposed on outer ends of the transparent electrodes 312b and 313b.

The sustaining electrodes 312 and 313 are covered by the front dielectric layer 315. The front dielectric layer 315 prevents the Y electrode 312 and the X electrode 313 from having a direct electrical connection therebetween, and shields the electrodes 312 and 313 from damage due to impact of charged particles during sustaining discharges. The front dielectric layer 315 is formed of a dielectric having a high light permeability, such as PbO, $B_2O_3$, and $SiO_2$.

The front dielectric layer 315 is, preferably, covered by protection film 316. The protection film 316 protects the front dielectric layer 315 from damage due to impact of charged particles during sustaining discharges, and generates a large number of secondary electrons. The protection film 316 can be formed of MgO.

A discharge gas is filled in the discharge cells 226. The discharge gas can be a gas mixture of Ne—Xe containing Xe 5-10%, and when necessary, He can replace Ne.

The operation of the PDP 300 having the above structure will now be briefly described. Address discharges occur by applying the address voltage Va between the address electrodes 222 and the Y electrodes 312, and as a result of the address discharge, discharge cells 226 in which a sustaining discharge occurs are selected. The selection of discharge cells 226 in which a sustaining discharge occurs denotes that wall charges are accumulated on regions adjacent to the X electrodes 313 and the Y electrodes 312 of the front dielectric layer 315 (the protection film 316 when the front dielectric layer 315 is covered by protection film 316) so as to cause sustaining discharges. When the address discharges are completed, positive ions are accumulated on a region adjacent to the Y electrodes 312, and electrons are accumulated on a region adjacent to the X electrodes 313.

After the address discharge, when a discharge sustaining voltage Vs is applied between the Y electrodes 312 and the X electrodes 313, sustaining discharges occur due to collision between the positive ions accumulated on a region adjacent to the Y electrodes 312 and the electrons accumulated on a region adjacent to the X electrodes 313. As the sustaining discharge proceeds, the discharge sustaining voltage Vs is alternately applied between the Y electrodes 312 and the X electrodes 313.

The energy level of the discharge gas is increased by the sustaining discharge, and the generation of ultraviolet rays reduces the amount of the increased energy level in the discharge gas. The ultraviolet rays increase the energy level of the fluorescent material included in the fluorescent layer 225 disposed in the discharge cells 226, and the emission of light reduces the amount of the increased energy level in the fluorescent material. An image is displayed by the visible light emitted from the discharge cells 226.

A significant amount of electromagnetic waves is generated during the operation of the PDP 300. The amount of electromagnetic waves generated must be reduced since the electromagnetic waves not only are harmful to humans but also cause malfunction in adjacent electronic devices. The PDP 300, according to the present invention, includes an electromagnetic wave shielding layer 301.

A central unit (the region equivalent to the central unit 110 in FIG. 3) of the electromagnetic wave shielding layer 301 is at least formed of a conductive material in a mesh design. The electromagnetic wave shielding layer 301 is fixed to a front surface 311a of the front substrate 311, and preferably the electromagnetic wave shielding layer 301 is formed directly on the front surface 311a of the front substrate 311 in the present embodiment.

After forming a conductive layer (a metal layer formed of Cu) having a thickness of approximately 3-15 μm on the entire front surface 311a of the front substrate 311, an electromagnetic wave shielding layer 301 can be formed in a predetermined pattern, such as a mesh shape, by etching the central unit (region equivalent to the central unit 110 in FIG. 3) of the conductive layer. When the central unit of the electromagnetic wave shielding layer 301 is formed in a mesh shape, the pitch of the mesh is, for example, 200-350 μm, and the line width of the mesh is, for example, 5-15 μm. However, the pitch and the line width of the mesh can be varied according to the variation of the resist pattern used for etching.

In FIG. 6, the electromagnetic wave shielding layer 301 is shown as protruding from the front surface 311a of the front substrate 311, but the electromagnetic wave shielding layer 301 can be disposed in grooves (not shown) formed in a pattern identical to the pattern of the electromagnetic wave shielding layer 301 on the front surface 311a of the front substrate 311.

As described above, when the electromagnetic wave shielding layer 301 is fixed to the front substrate 311, both the manufacturing cost of the electromagnetic wave shielding filter 100 and the conductive filter holder 20, and the time needed for coupling them to the front case 10, can be reduced.

Also, the heat generated by the plasma discharge in the PDP 300 can be readily dissipated to the outside since the air in front of the PDP 300 can be circulated freely without being interrupted by the electromagnetic wave shielding filter 100.

Furthermore, the electromagnetic wave shielding layer 301 is directly grounded without passing through other components, such as the chassis 30, the front case 10, the rear case 40, and the circuit unit. Therefore, the electromagnetic wave shielding layer 301 functions as a heat transfer means since the heat generated in the PDP 300 is transmitted to other components via the electromagnetic wave shielding layer 301.

Moreover, the electromagnetic wave shielding layer 301 rapidly transfers heat generated in a local region of the PDP 300 to other regions of the PDP 300. If the locally generated heat is not rapidly transferred to other regions, a latent image can occur on the image displayed on the local region.

As depicted in FIG. 6, the electromagnetic wave shielding layer 301 is preferably covered by a planarizing layer 302. The central unit of the electromagnetic wave shielding layer 301 has a mesh design, and the mesh design can interfere with the light being emitted from the fluorescent layer 225. The planarizing layer 302 minimizes the interference with light by the mesh, and prevents damage to the electromagnetic wave shielding layer 301 during manufacturing thereof.

A near infrared ray shielding layer 303 is preferably fixed to the front substrate 311. The discharge gas filled in the discharge cells includes Xe which emits near infrared rays during discharges. The near infrared rays are preferably shielded since they are harmful to humans, and may cause malfunction in adjacent electronic devices.

The near infrared ray shielding layer 303 includes a component that absorbs the near infrared rays. In FIG. 6, the near infrared ray shielding layer 303 is shown as being formed on the planarizing layer 302, but the location of the near infrared ray shielding layer 303 is not limited thereto. For example, it can be interposed between the electromagnetic wave shielding layer 301 and the front substrate 311, or between the front substrate 311 and the sustaining electrode pairs 314.

Also, in FIG. 6, the electromagnetic wave shielding layer 301 is shown as being formed and fixed on the front surface 311a of the front substrate 311, but the electromagnetic wave shielding layer 301 can be formed and fixed on a rear surface 311b of the front substrate 311. The term "formed" denotes that the electromagnetic wave shielding layer 301 is directly supported by contact with either the front surface 311a or the rear surface 311b of the front substrate 311, and the term "fixed" denotes that the electromagnetic wave shielding layer 301 is directly or indirectly supported by either the front surface 311a or the rear surface 311b of the front substrate 311.

When the electromagnetic wave shielding layer 301 is fixed to the rear surface 311b of the front substrate 311, the heat transfer efficiency of the electromagnetic wave shielding layer 301 is increased since the heat generated at the discharge cells 226 is directly transferred to the electromagnetic wave shielding layer 301 without passing through the front substrate 311.

When the electromagnetic wave shielding layer 301 is formed on the rear surface 311b of the front substrate 311, the near infrared ray shielding layer 303 can be interposed between the planarizing layer 302 that covers the electromagnetic wave shielding layer 301 and the sustaining electrode pair 314, or it can be disposed on the front surface 311a of the front substrate 311. On the other hand, the near infrared ray shielding layer 303 can be formed on the rear surface 311b of the front substrate 311, and the electromagnetic wave shielding layer 301 can be formed on the near infrared ray shielding layer 303.

Figure 7:
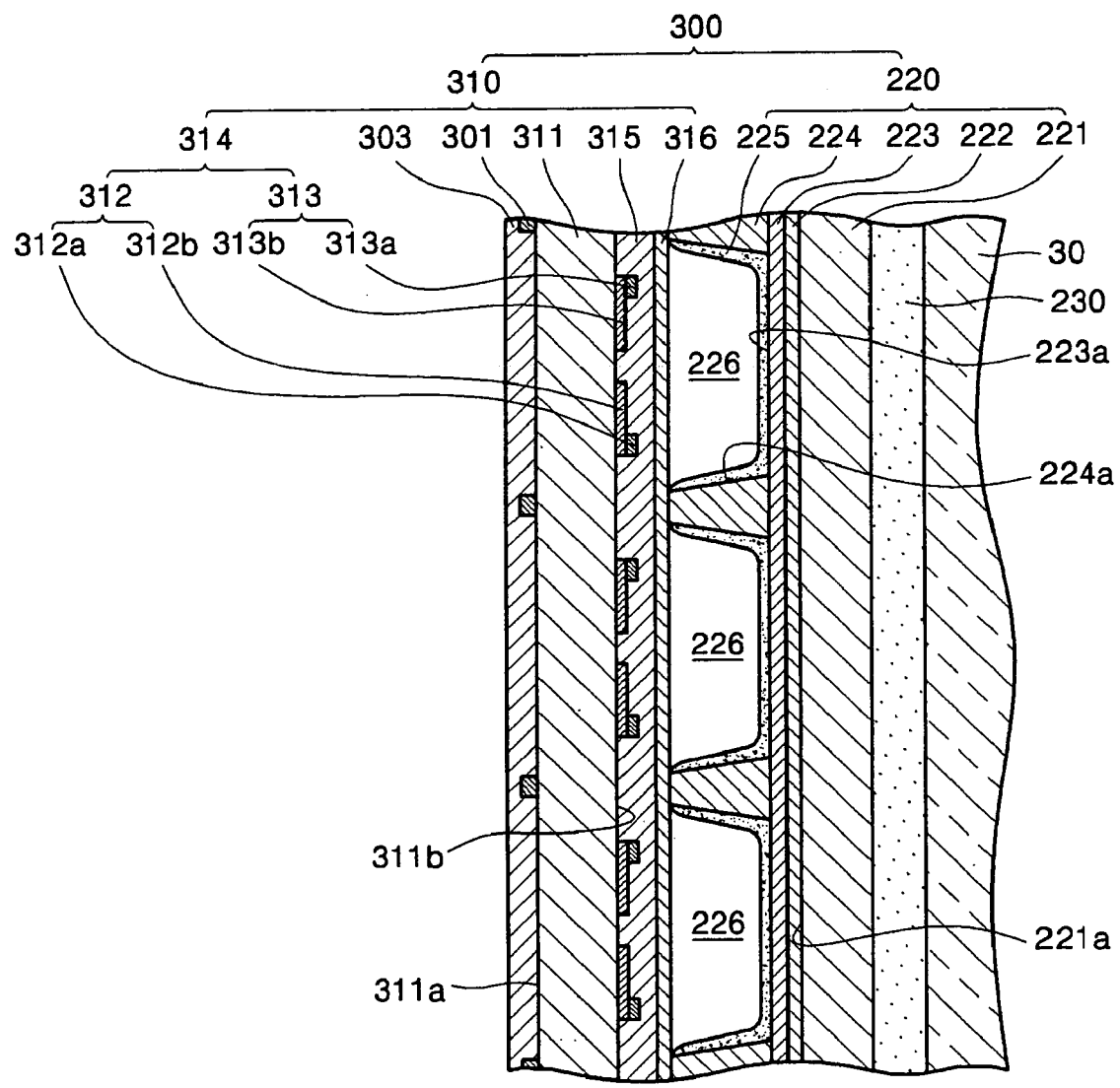
FIG. 7 is a cross-sectional view illustrating a PDP according to a first modified version of the first embodiment of the present invention.

FIG. 7 is a cross-sectional view illustrating a PDP according to a first modified version of the first embodiment of the present invention. Referring to FIG. 7, the first modified version of the first embodiment will be described mainly with respect to differences between the first embodiment and the first modified version. The main difference between the first modified version of the first embodiment and the first embodiment is that the electromagnetic wave shielding layer 301 in the first modified version is not covered by the planarizing layer 302 but is covered by the near infrared ray shielding layer 303. In this way, the process for forming the planarizing layer 302 can be omitted, thereby reducing manufacturing cost. The first modified version of the first embodiment can be applied to all types of PDP described in the first embodiment.

Figure 8:
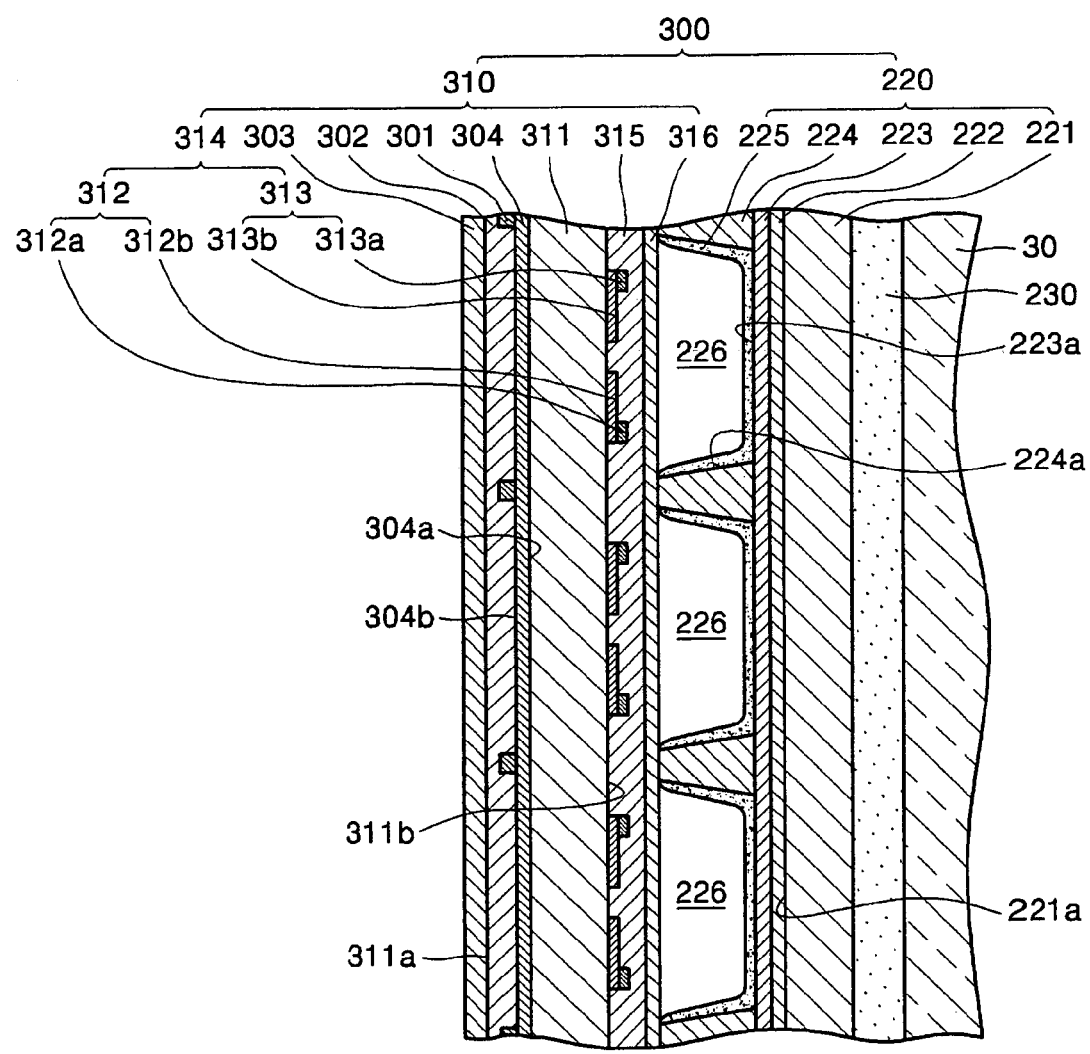
FIG. 8 is a cross-sectional view illustrating a PDP according to a second modified version of the first embodiment of the present invention.

FIG. 8 is a cross-sectional view illustrating a PDP according to a second modified version of the first embodiment of the present invention. FIGS. 9 through 13 are cross-sectional views illustrating a method of manufacturing an electromagnetic wave shielding filter of the PDP according to the second modified version of the first embodiment of the present invention.

Referring to FIGS. 8 through 13, the second modified version of the first embodiment will be described mainly with respect to differences between it and the first embodiment. The main difference between the second modified version of the first embodiment and the first embodiment is that the electromagnetic wave shielding layer 301 is formed by plating not by etching. The electromagnetic wave shielding layer 301 formed by plating must be separated from the electrodes for plating by attaching a dual-sided adhesive film 304, and accordingly, the electromagnetic wave shielding layer 301 is attached to the dual-sided adhesive film 304. The dual-sided adhesive film 304 includes a first surface 304a and a second surface 304b which are attached to the front surface 311a of the front substrate 311 and to the electromagnetic wave shielding layer 301, respectively.

Figure 9:
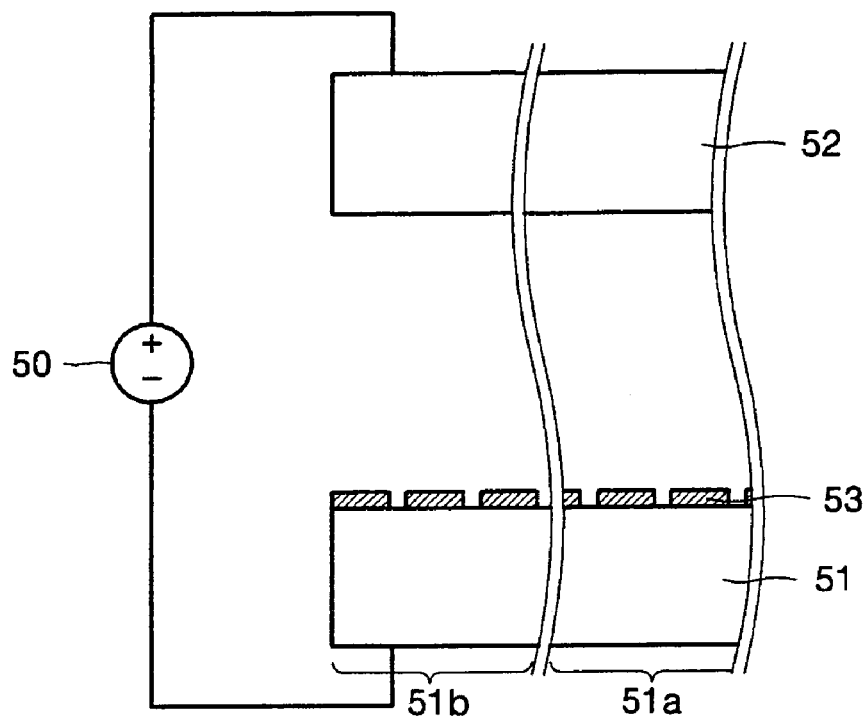
FIGS. 9 through 13 are cross-sectional views illustrating a method of manufacturing an electromagnetic wave shielding filter of the PDP according to the second modified version of the first embodiment of the present invention.

Referring to FIGS. 9 through 13, a method of attaching the electromagnetic wave shielding layer 301 to the dual-sided adhesive film 304 will be described. FIG. 9 is a partial cross-sectional view illustrating an operation of plating the electromagnetic wave shielding layer 301. Before this operation, a resist layer 53 is formed on an unplated portion of a first electrode sheet 51. The resist layer 53 is formed in a predetermined pattern through processes of exposure and development after being formed on the entire surface of the first electrode sheet 51.

For reference, when the electromagnetic wave shielding layer 301 is formed by plating, a conductive layer is preferably not formed on the entire surface of the perimeter unit (a region corresponding to the perimeter unit in FIG. 3) of the electromagnetic wave shielding layer 301.

To form the conductive layer on the entire surface of the perimeter unit of the electromagnetic wave shielding layer 301, the resist layer 53 must not be formed on the perimeter unit 51b of the first electrode sheet 51 as depicted in FIG. 9. In this case, the current density supplied to the perimeter unit 51b of the first electrode sheet 51 is lower than the current density supplied to the central unit 51a due to the resist layer 53 on the central unit 51a of the first electrode sheet 51. Accordingly, the thickness of the conductive layer (the perimeter unit of the electromagnetic wave shielding layer 301) plated on the perimeter unit 51b of the first electrode sheet 51 is small.

When the thickness of the perimeter unit 51b of the electromagnetic wave shielding layer 301 is small, the perimeter unit 51b of the electromagnetic wave shielding layer 301 may be damaged by clamps which allow for an electrical connection with other components, such as the chassis 30, the front case 10, the rear case 40, and the circuit unit. Damage to the electromagnetic wave shielding layer 301 can deteriorate the electrical connection with the other components described above, and this leads to malfunction of the shielding function of the electromagnetic wave shielding layer 301. Therefore, as depicted in FIG. 9, the resist layer 53 is formed in a predetermined pattern on the perimeter unit 51b of the first electrode sheet 51.

In the plating stage as depicted in FIG. 9, metal is plated on a region, on which the resist layer 53 is not formed, of the first electrode sheet 51 by flowing current supplied from a power source into the first electrode sheet 51 and a second electrode sheet 52 after immersing the first and second electrode sheets 51 and 52, respectively, in a solution in which a metal to be plated, such as Cu, is dissolved.

Figure 10:
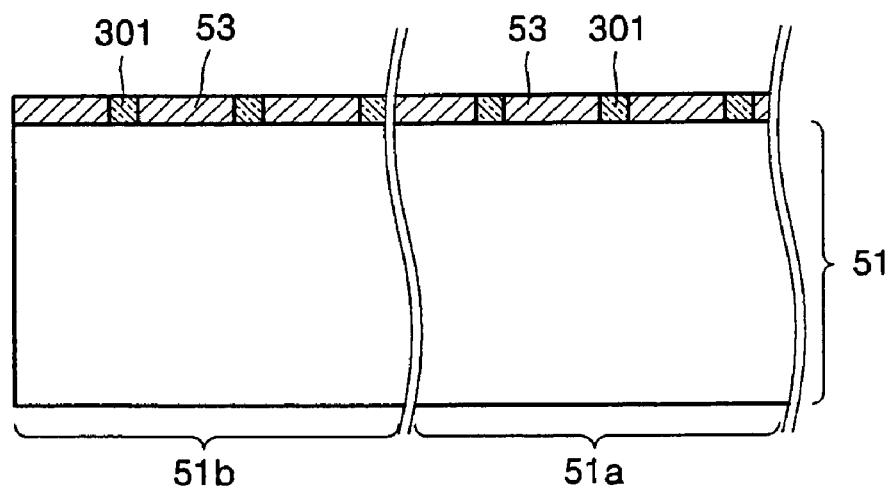
Figure 11:
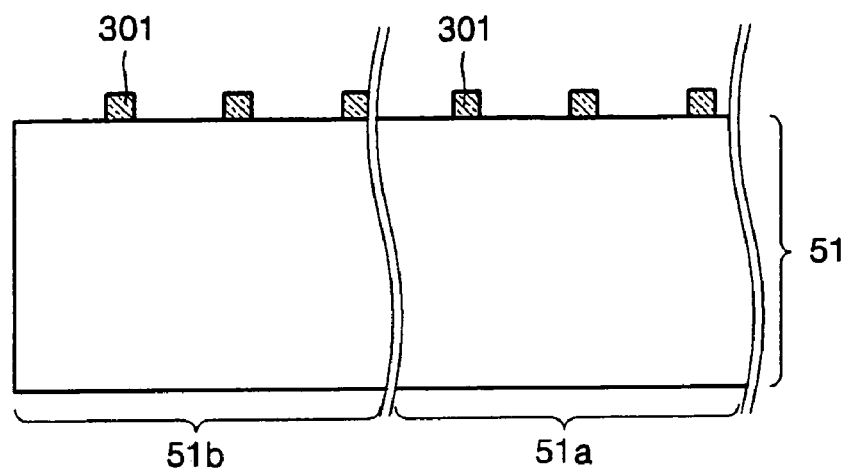

FIG. 10 is a partial cross-sectional view of the first electrode sheet 51 on which the electromagnetic wave shielding layer 301 is formed by plating. The resist layer 53 is removed only after forming the electromagnetic wave shielding layer 301 on the first electrode sheet 51. Referring to FIG. 1, the resist layer 53 is removed.

Figure 12:
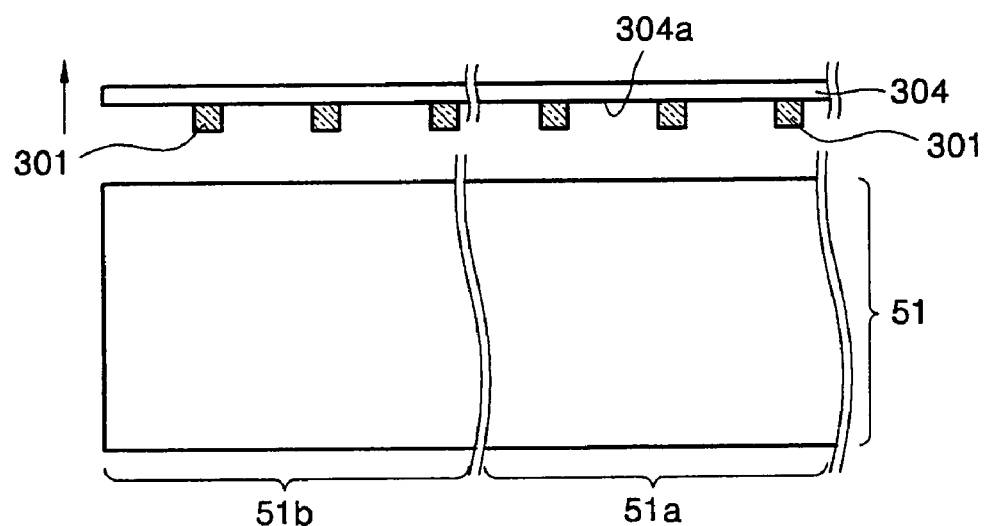

The electromagnetic wave shielding layer 301 is separated from the first electrode sheet 51 after removing the resist layer 53. As depicted in FIG. 12, the electromagnetic wave shielding layer 301 is separated from the first electrode sheet 51 by separating the dual-sided adhesive film 304 from the first electrode sheet 51. At this time, the electromagnetic wave shielding layer 301 is attached to a first surface 304a of the dual-sided adhesive film 304.

Figure 13:
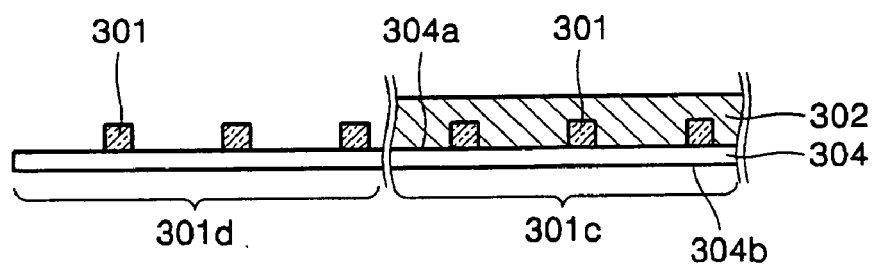

After the separation of the electromagnetic wave shielding layer 301 from the first electrode sheet 51, as depicted in FIG. 13, a central unit 301c of the electromagnetic wave shielding layer 301 can be covered by the planarizing layer 302. At least a portion of a perimeter unit 301d of the electromagnetic wave shielding layer 301 is not covered by the planarizing layer 302 since that portion must be clamped to create an electrical connection with other components. This is identical to the case of the electromagnetic wave shielding layer 301 being covered by the near infrared ray shielding layer 303.

A second surface 304b of the dual-sided adhesive film 304 is, for example, attached to the front surface 311a of the front substrate 311.

In FIG. 8, the near infrared ray shielding layer 303 is shown as being formed on the planarizing layer 302, but the location of the near infrared ray shielding layer 303 is not limited thereto. That is, the near infrared ray shielding layer 303 can be interposed between the dual-sided adhesive film 304 and the front substrate 311, or between the front substrate 311 and the sustaining electrode pair 314.

In FIG. 8, the electromagnetic wave shielding layer 301 is shown as being fixed to the front surface 311a of the front substrate 311 by the dual-sided adhesive film 304, but the electromagnetic wave shielding layer 301 can be fixed to the rear surface 311b of the front substrate 311. When the electromagnetic wave shielding layer 301 is fixed to the rear surface 311b of the front substrate 311, the first surface 304a of the dual-sided adhesive film 304 is attached to the rear surface 311b of the front substrate 311, and the electromagnetic wave shielding layer 301 is attached to the second surface 304b of the dual-sided adhesive film 304.

When the electromagnetic wave shielding layer 301 is fixed to the rear surface 311b of the front substrate 311, the near infrared ray shielding layer 303 can be interposed between the planarizing layer 302 that covers the electromagnetic wave shielding layer 301 and the sustaining electrode pair 314, or it can be disposed on the front surface 311a of the front substrate 311. On the other hand, the near infrared ray shielding layer 303 can be formed on the rear surface 311b of the front substrate 311, and the first surface 304a of the dual-sided adhesive film 304 can be attached to the near infrared ray shielding layer 303.

The second modified version can be applied to all types of the PDP 300 described in the first embodiment.

Figure 14:
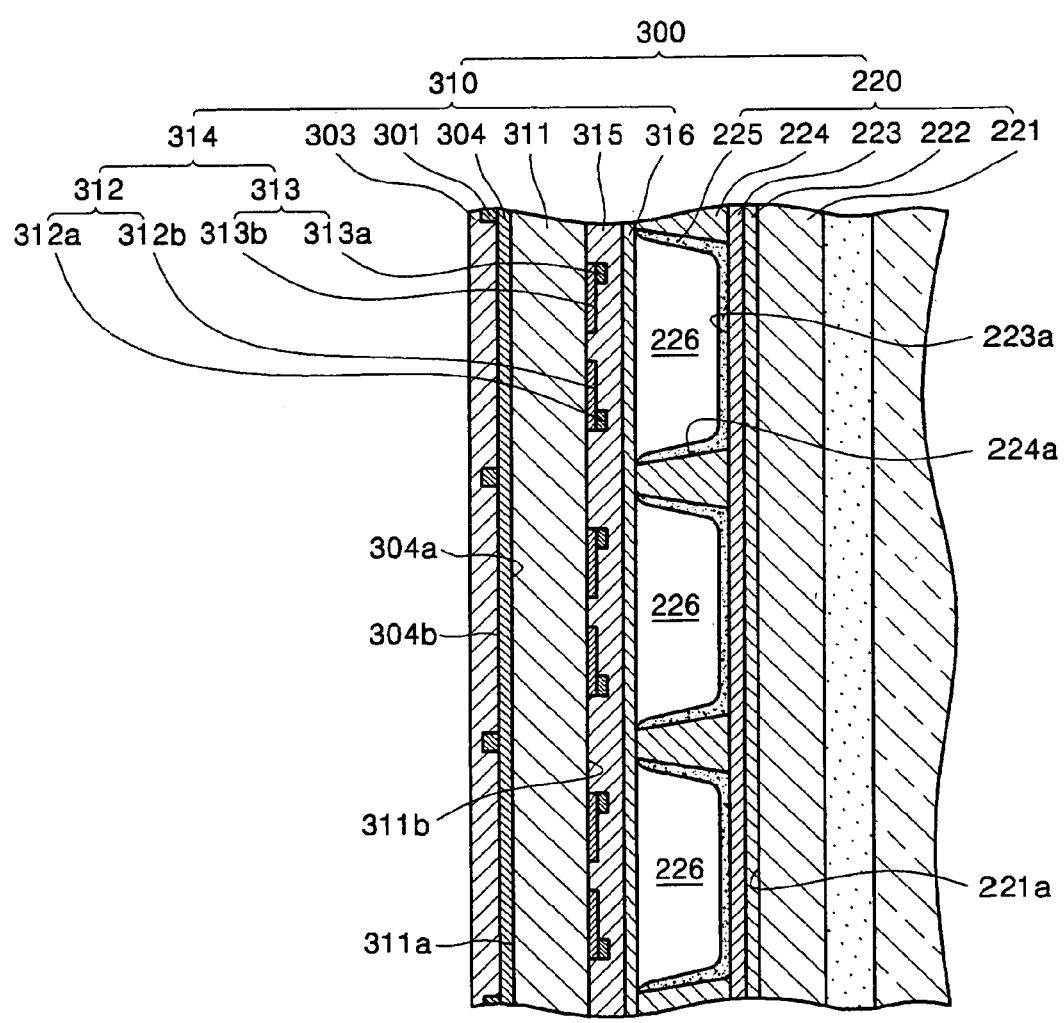
FIG. 14 is a cross-sectional view illustrating a PDP according to a third modified version of the first embodiment of the present invention.

FIG. 14 is a cross-sectional view illustrating a PDP according to a third modified version of the first embodiment of the present invention. Referring to FIG. 14, the third modified version of the first embodiment will be described mainly with respect to the differences between the third modified version and the second modified version of the first embodiment. The main differences between the third modified version and the second modified version is that the electromagnetic wave shielding layer 301 is not covered by the planarizing layer 302, but it is covered by the near infrared ray shielding layer 303. In this way, the process of manufacturing the planarizing layer 302 can be omitted, thereby reducing manufacturing cost. The third modified version can be applied to all types of the PDP described in the second modified version.

Hereinafter, a second embodiment will be described mainly with respect to the differences between second embodiment and the first embodiment with reference to FIGS. 15 through 17.

Figure 15:
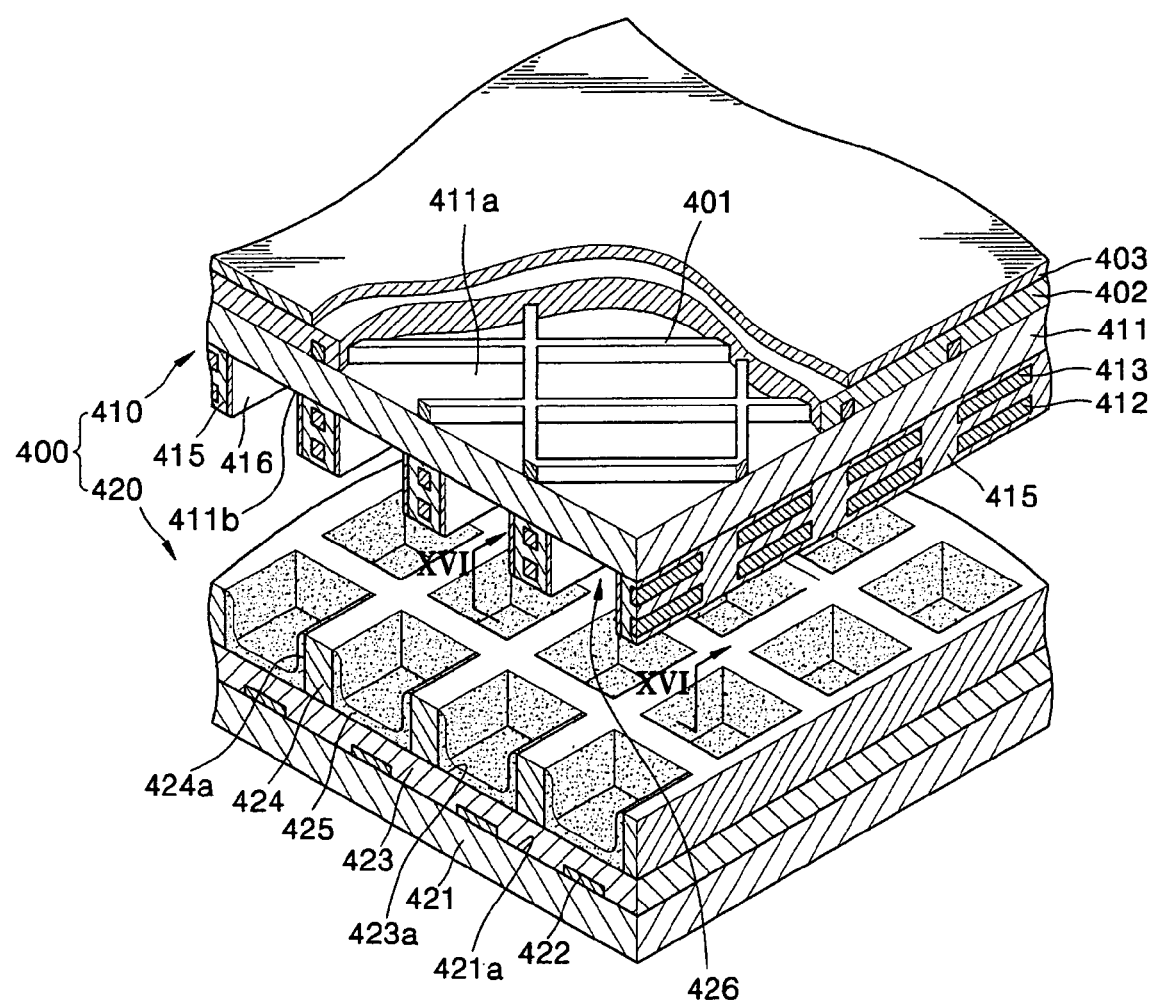
FIG. 15 is a partially cutaway exploded perspective view of a PDP according to a second embodiment of the present invention.
Figure 16:
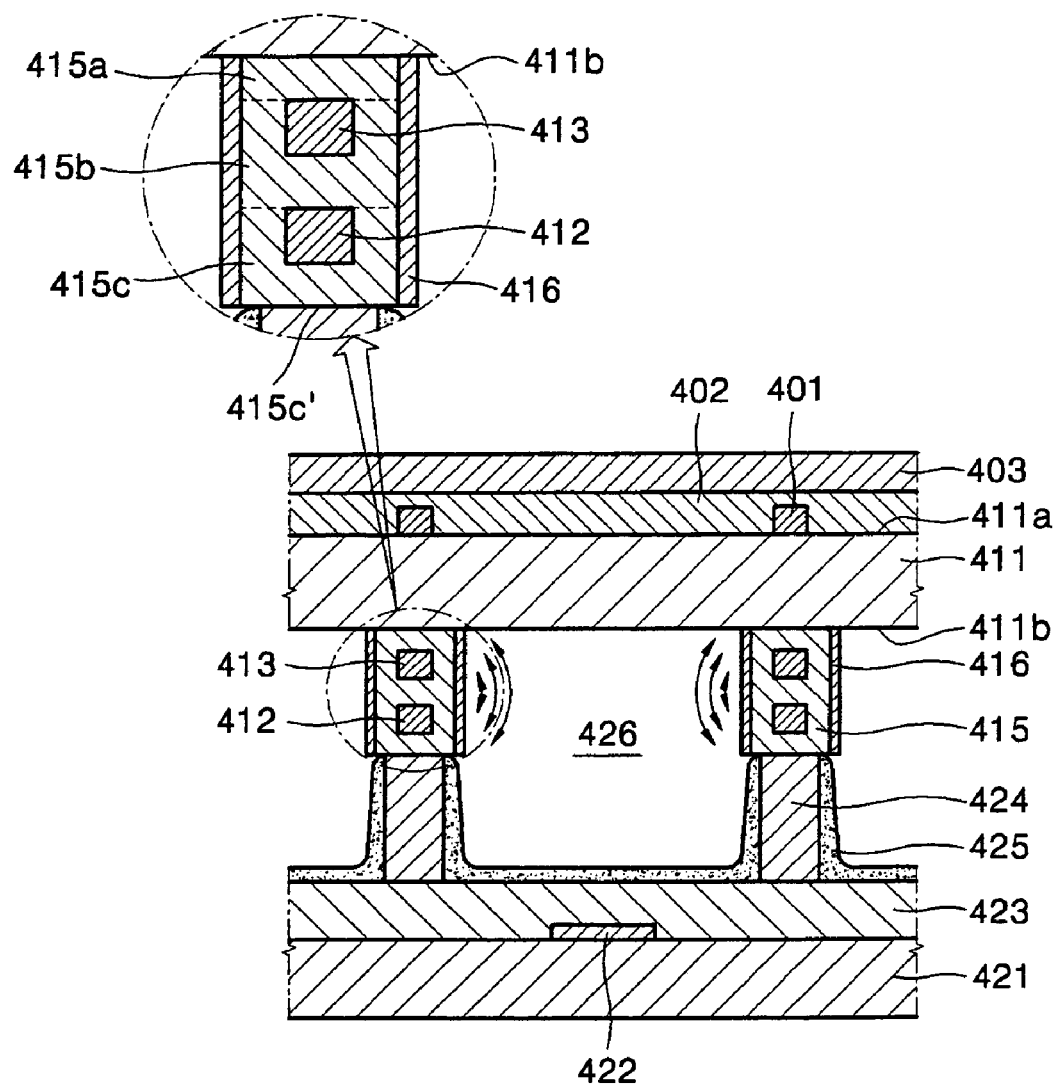
FIG. 16 is a cross-sectional view taken along line XVI-XVI of FIG. 15.

As depicted in FIGS. 15 and 16, a PDP 400 according to the second embodiment of the present invention includes a front panel 410 and a rear panel 420.

The front panel 410 comprises a front substrate 411, front barrier ribs 415 defining the discharge cells 426 and formed of a dielectric disposed on a rear surface 411b of the front substrate 411, a plurality of front discharge electrodes 413 and rear discharge electrodes 412 embedded in the front barrier ribs 415 so as to surround the discharge cells 426, and an electromagnetic wave shielding layer 401 fixed on the front substrate 411. When necessary, the PDP 400 can further include a protection layer 416 that covers the front barrier ribs 415, a planarizing layer 402 the covers the electromagnetic wave shielding layer 401, and a near infrared ray shielding layer 403 formed on the planarizing layer 402. A discharge gas is filled in the discharge cells 426.

The rear panel 420 comprises a rear substrate 421 disposed parallel to the front substrate 411, a plurality of address electrodes 422 extending over a row of the discharge cells 426, a dielectric layer 423 that covers the address electrodes 422, a plurality of rear barrier ribs 424 formed on the dielectric layer 423, and a plurality of fluorescent layer 425 disposed in a space defined by the rear barrier ribs 424.

Figure 17:
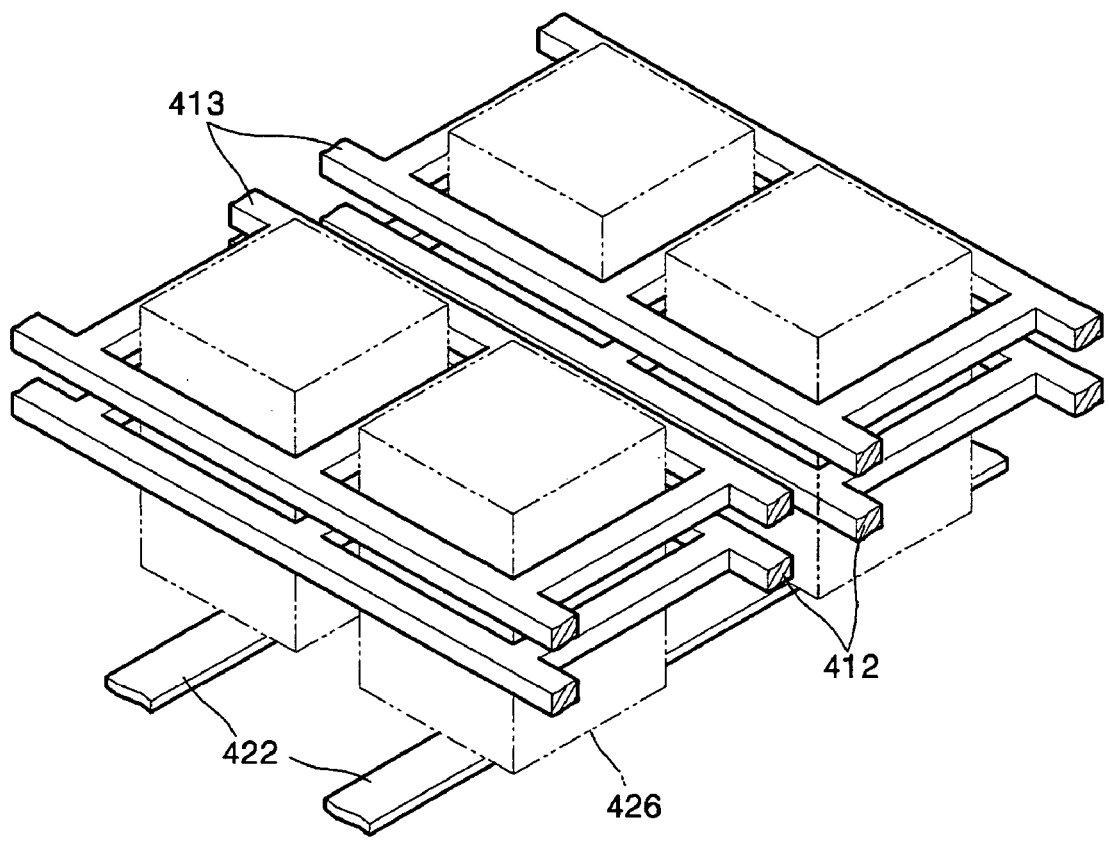
FIG. 17 is a partially cutaway perspective view of discharge cells and electrodes in FIG. 15.

As depicted in FIG. 17, in the case of the present embodiment, one of the front discharge electrodes 413 and one of the rear discharge electrodes 412 extend in parallel with each other so as to form a pair, and the address electrodes 422 extend so as to cross the front and rear discharge electrodes 412 and 413, respectively. However, this structure of PDP 400 according to the present embodiment is limited when the PDP 400 is designed to operate by address discharge between one of the rear discharge electrodes 412 and the front discharge electrodes 413, and the address electrodes 422, and by a sustaining discharge between the rear discharge electrodes 412 and the front discharge electrodes 413.

In contrast to the present embodiment, when the PDP 400 is only operated by the discharge between the rear discharge electrodes 412 and the front discharge electrodes 413, the aforementioned address electrodes 422 and the dielectric layer 423 that covers the address electrodes 422 are unnecessary, and accordingly, the rear barrier ribs 424 are formed on a front surface 421a of the rear substrate 421. Also, in this case, the rear discharge electrodes 412 and the front discharge electrodes 413 extend so as to cross each other.

The front substrate 411 and the rear substrate 412 are formed of a transparent material, such as glass. The sustaining electrode pair 314, the front dielectric layer 315 that covers the sustaining electrode pair 314, and the protection layer 316, which are present on the front substrate 311 in the first embodiment, are not present on a portion of the rear surface 411b of the front substrate 411 that define the discharge cells 426. Therefore, the permeability of visible light emitted from the fluorescent layer 425 is significantly increased from a conventional rate of 60% to 90%.

The front barrier ribs 415 are formed on a rear surface 411b of the front substrate 411 so as to define the discharge cells 426. In FIG. 15, the front barrier ribs 415 are depicted as partitioning the discharge cells 426 in a matrix, but they are not limited thereto. That is, the front barrier ribs 415 can be defined in the shape of a honeycomb or other shapes. Also, in FIG. 17, the horizontal cross-section of the discharge cells 426 is depicted as being a rectangular shape, but it is not limited thereto. For example, it may be in the shape of a triangle, a polygon, a circle, or an oval.

The front barrier ribs 415 are formed of a dielectric which can prevent direct cross-talk between the rear discharge electrodes 412 and adjacent front discharge electrodes 413, and which can prevent the front and rear discharge electrodes 412 and 413 from being damaged by the impact of charged particles during sustaining discharges. Dielectrics that can be used for this purpose are PbO, $B_2O_3$, and $SiO_2$.

As depicted in FIG. 16, at least a side surface of the front barrier ribs 415 is preferably covered by the protection layer 416. The protection layer 416 can be formed by a method such as deposition. In this case, the protection layer 416 may be formed on a rear surface 415c' of the front barrier ribs 415 and on a rear surface 411b of the front substrate 411 when depositing the protection layer 416. However, the protection layer 416 formed on the rear surface 415c' of the front barrier ribs 415 and on the rear surface 411b of the front substrate 411 do not adversely affect the operation of the PDP 400 according to the present embodiment.

The rear discharge electrodes 412 and the front discharge electrodes 413 that surround the discharge cells 426 are disposed in the front barrier ribs 415. In order to dispose the front and rear discharge electrodes 412 and 413, respectively, in the front barrier rib 415, as depicted in FIG. 16, a first front barrier rib 415a can be formed on a rear surface 411b of the front substrate 411, and the front discharge electrodes 413 can be formed on the first front barrier ribs 415a. Subsequently, a second front barrier rib 415b can be formed to cover the front discharge electrode 413, the rear discharge electrode 412 can be formed on the second front barrier rib 415b, and a third front barrier rib 415c can be formed to cover the rear discharge electrode 412. When necessary, each of the first front barrier rib 415a, the second front barrier ribs 415b, and the third front barrier rib 415c can be formed in more than two layers so as to make the layer thicker.

The rear discharge electrodes 412 and the front discharge electrodes 413 are electrodes for producing sustaining discharges, and the sustaining discharge that displays an image on the PDP 400 occurs between the front and rear discharge electrodes 413 and 412, respectively. The front and rear discharge electrodes 413 and 412, respectively, can be formed of a conductive metal, such as Al or Cu.

The PDP 400 operated by address discharge and sustaining discharge includes a sustaining electrode pair that includes an X electrode and a Y electrode and one address electrode 422. The address discharge occurs between the Y electrode and the address electrode 422. Therefore, when the address electrode 422 is disposed on a rear of the front and rear discharge electrodes 413 and 412, respectively, the rear discharge electrodes 412 are preferably the Y electrodes. If the rear discharge electrodes 412 are Y electrodes, the front discharge electrodes 413 are the X electrodes.

Unlike the sustaining electrodes 312 and 313 in the first embodiment, the front and rear discharge electrodes 413 and 412, respectively, in the present embodiment have a relatively large region of occurring sustaining discharge since the front and rear discharge electrodes 413 and 412, respectively, surround the discharge cells 426. Therefore, the luminous efficiency of the PDP 400 of the present embodiment is higher than that of the PDP 300 of the first embodiment.

As depicted in FIG. 16, in the discharge cells 426 of the PDP 400 according to the present invention, the amount of ion sputtering to the fluorescent material by the charged particles can be reduced since the sustaining discharge occurs only on a front portion of the discharge cell (a portion close to the front substrate 411), thereby reducing the possibility of a permanent residual image due to degradation of the fluorescent layer 425.

In FIG. 15, the address electrodes 422 are disposed on an upper surface 421a of the rear substrate 421, but the locations of the address electrodes 422 are not limited thereto. For example, the address electrodes 422 can be disposed so as to surround the discharge cells 426 in the front barrier ribs 415. In this case, the address electrodes 422 have a shape similar to that of the front and rear discharge electrodes 412 and 413, but the difference is that the address electrodes 422 extend in a direction so as to cross the front and rear discharge electrodes 412 and 413, respectively. Also, in this case, the address electrodes 422 can be interposed between the front discharge electrodes 413 and the front substrate 411, between front discharge electrodes 413 and the rear discharge electrodes 412, or between the rear discharge electrodes 412 and the rear barrier ribs 424. Wherever the address electrode 422 is disposed, the address electrode 422 is insulated from the front and rear discharge electrodes 412 and 413, respectively. The address electrodes 422 can be disposed on a rear surface 411b of the front substrate 411, but, in that case, the address electrodes 422 must be covered by the dielectric layer 423.

The address electrodes 422 depicted in FIG. 15 are covered by the dielectric layer 423. The dielectric layer 423 is formed of a dielectric material that can shield the address electrodes 422 from the charged particles during discharges, and that can induce charged particles, such as PbO, $B_2O_3$, or $SiO_2$.

The rear barrier ribs 424 are formed on the dielectric layer 423. The rear barrier ribs 424 define a region for a fluorescent layer that includes a fluorescent material for emitting red light, a region for a fluorescent layer that includes a fluorescent material for emitting green light, and a region for a fluorescent layer that includes a fluorescent material for emitting blue light. To form the fluorescent layer 425, a paste, which is a mixture of fluorescent materials of red, green, and blue, a solvent and a binder, is coated on a front surface 423a of the dielectric layer 423 and on a side surface 424a of the rear barrier ribs 424. Afterward, through processes of drying and sintering of the coated paste, the fluorescent layer 425 is formed. The fluorescent material(s) for emitting red light is $Y(V,P)O_4$:Eu, for green light are $Zn_2SiO_4$:Mn and $YBO_3$:Tb, and for blue light is BAM:Eu.

In FIGS. 15 and 16, the rear barrier ribs 424 are depicted as being patterned in an identical pattern on the front barrier ribs 415. However, the pattern (shape) of the rear barrier ribs 424 is not necessarily identical to that of the front barrier ribs 415, but it can be formed in a stripe shape.

A discharge gas is filled in the discharge cells 426. The discharge gas can be a gas mixture of Ne—Xe containing Xe 5-10%, and when necessary, Ne can be replaced by He.

The operation of the PDP 400 having the above structure will now be briefly described. An address discharge occurs by applying an address voltage between the address electrodes 422 and the Y electrodes 412, and as the result of the address discharge, a discharge cell 426 where a sustaining discharge occurs is selected. The selection of the discharge cell where a sustaining discharge occurs denotes that wall charges are accumulated on a region adjacent to the X electrode 413 and the Y electrode 412 of the front barrier ribs 415 (the protection layer 416 when the front barrier ribs 415 is covered by the protection layer 416). When the address discharge is completed, a portion of positive ions are accumulated on a region adjacent to the Y electrode 412, and electrons are accumulated on a region adjacent to the X electrode 413.

After the address discharge, when a discharge sustaining voltage Vs is applied between the Y electrode 412 and the X electrode 413 of the selected discharge cells 426, a sustaining discharge occurs due to collision of the positive ions accumulated on the region adjacent to the Y electrode 412 with the electrons accumulated on the region adjacent to the X electrode 413. As the sustaining discharge proceeds, the discharge sustaining voltage Vs is alternately applied to the Y electrode 412 and the X electrode 413.

The energy level of the discharge gas increases as a result of the sustaining discharges, and the increased energy level of the discharge gas decreases due to generation of ultraviolet rays. The ultraviolet rays increase the energy level of the fluorescent material included in the fluorescent layer 425 disposed in the discharge cells 426, and the emission of light reduces the amount of the increased energy level in the fluorescent material. An image is displayed by the visible light emitted from the discharge cells 426.

A significant amount of electromagnetic waves is generated during operation of the PDP 400. The amount of electromagnetic waves generated must be reduced since the electromagnetic waves not only are harmful to humans but also cause the malfunction of adjacent electronic devices. The PDP 400 according to the present embodiment includes an electromagnetic wave shielding layer 401 which reduces the amount of electromagnetic waves emitted to the outside.

A central unit (the region equivalent to the central unit 110 in FIG. 3) of the electromagnetic wave shielding layer 401 is formed at least of a conductive material in a mesh design. The electromagnetic wave shielding layer 401 is fixed to a front surface 411a of the front substrate 411, and preferably, in the present embodiment, the electromagnetic wave shielding layer 401 is directly formed on the front surface 411a of the front substrate 411. As described in the first embodiment, the electromagnetic wave shielding layer 401 can be formed by etching or plating to a thickness of approximately 3-15 μm. When the electromagnetic wave shielding layer 301 is formed in a mesh design, the pitch of the mesh is, for example, 200-350 μm, and the line width of the mesh is, for example, 5-15 μm. However, the pitch and the line width of the mesh can vary when necessary. Also, as described in the first embodiment, the electromagnetic wave shielding layer 401 can be disposed in grooves (not shown) formed in a pattern identical to the pattern of the electromagnetic wave shielding layer 401 and on the rear surface 411b of the front substrate 411.

As described in the first embodiment, when the electromagnetic wave shielding layer 401 is fixed to the front substrate 411, the cost and time of manufacturing the plasma display device are reduced, heat generated in the PDP during discharge can be readily dissipated, and the occurrence of latent images can be prevented or reduced by prompt transfer of heat generated in a portion of the PDP 400 to a different region of the panel.

As depicted in FIG. 15, the electromagnetic wave shielding layer 401 according to the present embodiment is preferably covered by the planarizing layer 402, and the near infrared ray shielding layer 403 is preferably fixed to the front substrate 411. The functions of the planarizing layer 402 and the near infrared ray shielding layer 403 are the same as those of the planarizing layer 302 and the near infrared ray shielding layer 303, respectively, and therefore the description thereof will be omitted.

In FIG. 15, the near infrared ray shielding layer 403 is depicted as being formed on the planarizing layer 402, but the location of the near infrared ray shielding layer 403 is not limited thereto. That is, the near infrared ray shielding layer 403 can be disposed between the electromagnetic wave shielding layer 401 and the front substrate 411, or between the front substrate 411 and the front barrier ribs 415. Also, the electromagnetic wave shielding layer 401 can be fixed to the front surface 411a of the front substrate 411 or to the rear surface 411b of the front substrate 411.

When the electromagnetic wave shielding layer 401 is fixed to the rear surface 411b of the front substrate 411, the heat radiation efficiency and heat transfer efficiency of the electromagnetic wave shielding layer 401 can be increased since the heat generated in the discharge cells 426 can be directly transferred to the electromagnetic wave shielding layer 401 without direct transfer to the front substrate 411.

When the electromagnetic wave shielding layer 401 is formed on the rear surface 411b of the front substrate 411, the near infrared ray shielding layer 403 can be interposed between the planarizing layer 402 that covers the electromagnetic wave shielding layer 401 and the front barrier ribs 415, or it can be disposed on a front surface 411a of the front substrate 411. On the other hand, the near infrared ray shielding layer 403 can be formed on a rear surface 411b of the front substrate 411, and the electromagnetic wave shielding layer 401 can be formed on the near infrared ray shielding layer 403.

The PDP 400 according to the second embodiment can also be modified in accordance with the first through third modified versions of the first embodiment.

A third embodiment of the present invention will be described mainly with respect to the differences between the second and third embodiments, with reference to FIGS. 18 and 19. The main difference between the third embodiment and the second embodiment is that the PDP 400, according to the third embodiment, includes barrier rib 524 in which the front barrier rib 415 and the rear barrier rib 424 of the second embodiment are formed in one body. The one-body characteristic of the front barrier rib 415 and the rear barrier rib 424 denotes that a front unit 524a of the barrier rib 524 corresponding to the front barrier rib 415 and the rear unit 524b of the barrier rib 524 corresponding to the rear barrier rib 424 cannot be separated without being broken, but does not denote that the barrier rib 524 is formed by a single process.

Figure 18:
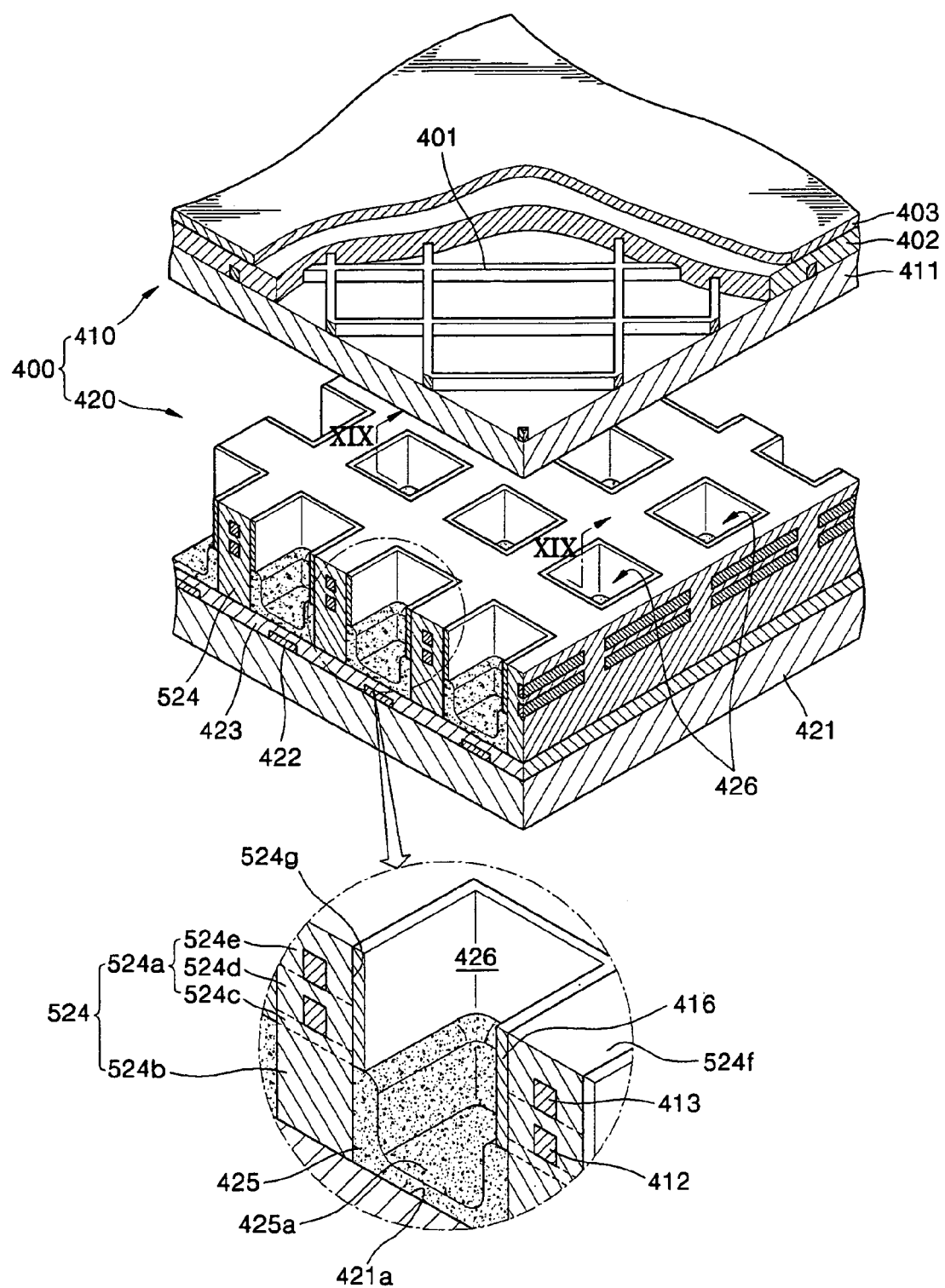
FIG. 18 is a partially cutaway exploded perspective view of a PDP according to a third embodiment of the present invention.
Figure 19:
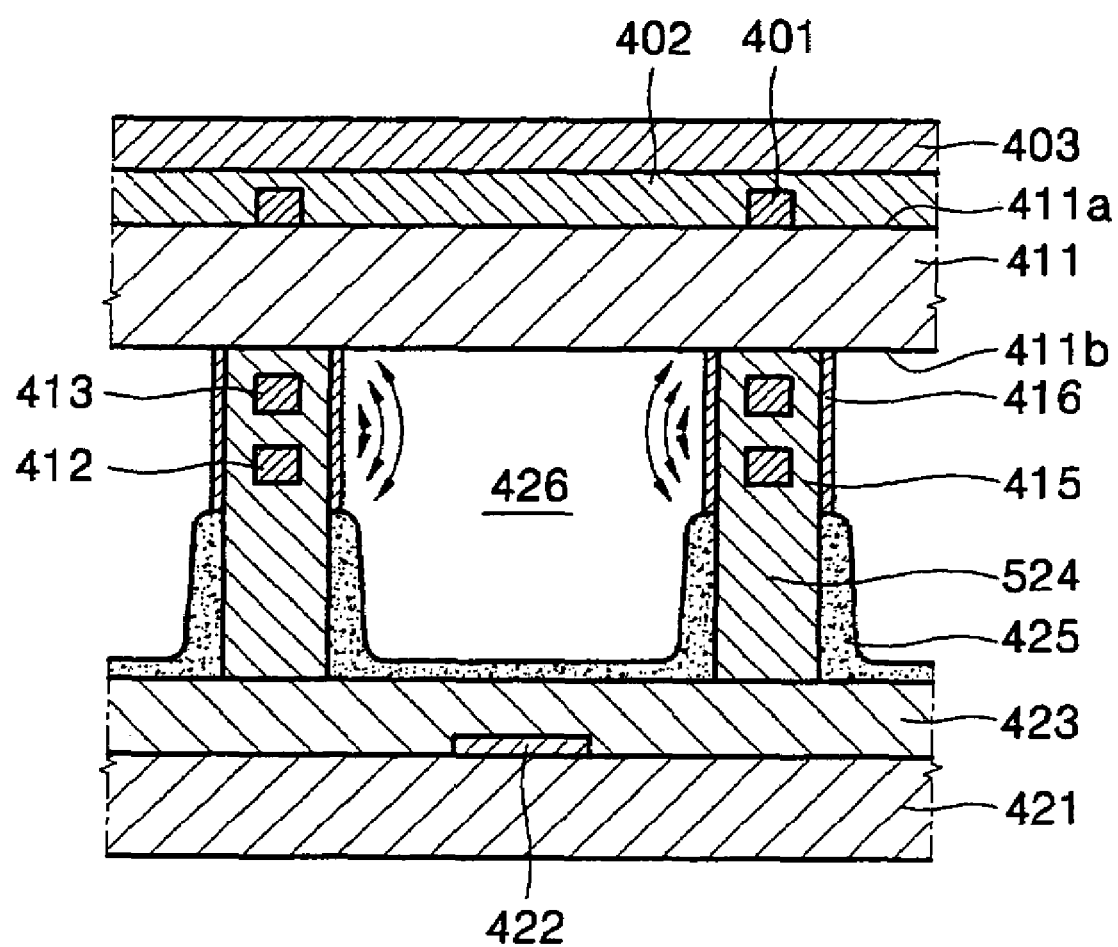
FIG. 19 is a cross-sectional view taken along line XIX-XIX in FIG. 18.

To manufacture the rear panel 420 of the PDP 400 as depicted in FIG. 18, the rear unit 524b of the barrier rib 524 is formed on an upper surface 412a of the rear substrate 421. When the rear unit 524b is formed, a paste that contains a fluorescent material is filled in a space defined by the rear unit 524b, and then the paste is dried and sintered.

Afterward, in sequence, a first barrier rib layer 524c is formed on the rear unit 524b of the barrier rib 524, the rear discharge electrodes 412 are formed on the first barrier rib layer 524c, a second barrier rib layer 524d is formed to cover the rear discharge electrodes 412, the front discharge electrodes 413 are formed on the second barrier rib layer 524d, and a third barrier rib layer 524e is formed to cover the front discharge electrodes 413. When necessary, each of the rear unit 524b, the first barrier rib layer 524c, the second barrier rib layer 524d and the third barrier rib layer 524e can be formed in more than two layers (so as to make the layers thick).

The protection layer 416 is formed by deposition on at least a side surface 524g of the barrier rib 524 after forming the barrier rib 524 that buries the front and rear discharge electrodes 412 and 413 using the method described above. The protection layer 416 may also be formed on an upper surface 425a of the fluorescent layer 425 and on a front surface 524f of the barrier rib 524 when depositing the protection layer 416. However, the protection layers 416 formed on the upper surface 425a of the fluorescent layer 425 and on the front surface 524f of the barrier rib 524 do not adversely affect to the operation of the PDP according to the present embodiment.

Due to the differences between the third embodiment and the second embodiment, the front panel 410 of the third embodiment comprises the front substrate 411 and the electromagnetic wave shielding layer 401, and when necessary, the front panel 410 further comprises the planarizing layer 402 and the near infrared ray shielding layer 403.

Functions of components in the third embodiment are the same as the functions of components in the second embodiment except as described above. Also, the PDP 400 according to the third embodiment can be modified in accordance with the first through third modified versions of the first embodiment.

The present invention provides a PDP that can reduce the manufacturing cost and time for a plasma display device. The present invention also provides a PDP with improved heat transfer efficiency.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A plasma display panel (PDP), comprising:
a transparent front substrate;
a rear substrate disposed parallel to the front substrate;
an electromagnetic wave shielding layer fixed to the front substrate;
a plurality of discharge cells defined by barrier ribs disposed between the front substrate and the rear substrate;
a plurality of address electrodes extending over the discharge cells and disposed in a given direction;
a rear dielectric layer covering the address electrodes;
a plurality of fluorescent layers disposed in the discharge cells;
a plurality of sustaining electrode pairs extending in a direction which crosses the given direction of the address electrodes;
a front dielectric layer covering the sustaining electrode pairs;
a discharge gas filling the discharge cells; and
a planarizing layer for covering the electromagnetic wave shielding layer.

2. The PDP of claim 1, wherein the electromagnetic wave shielding layer is fixed to a front surface of the front substrate.

3. The PDP of claim 2, wherein the electromagnetic wave shielding layer is formed on a front surface of the front substrate.

4. The PDP of claim 2, wherein the electromagnetic wave shielding layer is attached to a front surface of the front substrate using a dual-sided adhesive film.

5. The PDP of claim 1, wherein the electromagnetic wave shielding layer is fixed to a rear surface of the front substrate.

6. The PDP of claim 5, wherein the electromagnetic wave shielding layer is formed on a rear surface of the front substrate.

7. The PDP of claim 5, wherein the electromagnetic wave shielding layer is attached to a rear surface of the front substrate using a dual-sided adhesive film.

8. The PDP of claim 1, wherein the address electrodes are disposed between the rear substrate and the rear dielectric layer, the barrier ribs are disposed on the rear dielectric layer, the sustaining electrode pairs are disposed between the front substrate and the front dielectric layer, and the front dielectric layer is covered by a protection layer.

9. A plasma display panel (PDP), comprising:
a transparent front substrate;
a rear substrate disposed parallel to the front substrate;
an electromagnetic wave shielding layer fixed to the front substrate;
a plurality of discharge cells defined by barrier ribs disposed between the front substrate and the rear substrate;
a plurality of address electrodes extending over the discharge cells and disposed in a given direction;
a rear dielectric layer covering the address electrodes;
a plurality of fluorescent layers disposed in the discharge cells;
a plurality of sustaining electrode pairs extending in a direction which crosses the given direction of the address electrodes;
a front dielectric layer covering the sustaining electrode pairs;
a discharge gas filling the discharge cells; and
a near infrared ray shielding layer fixed to the front substrate;
wherein the electromagnetic wave shielding layer is covered by the near infrared ray shielding layer.

10. A PDP, comprising:
a transparent front substrate;
a rear substrate disposed parallel to the front substrate;
an electromagnetic wave shielding layer fixed to the front substrate;
a plurality of front barrier ribs defining discharge cells, formed of a dielectric, and disposed between the front substrate and the rear substrate;
a plurality of front discharge electrodes and rear discharge electrodes disposed on the front barrier ribs so as to surround the discharge cells;
a plurality of rear barrier ribs disposed between the front barrier ribs and the rear substrate;

a plurality of fluorescent layers disposed in a space defined by the rear barrier ribs; and a discharge gas filling the discharge cells;

wherein the front discharge electrodes and the rear discharge electrodes extend in directions parallel to each other, said PDP further comprising address electrodes extending so as to cross the front discharge electrodes and the rear discharge electrodes.

11. The PDP of claim 10, wherein a side surface of the front barrier ribs is covered by a protection layer, the address electrodes are disposed between the rear substrate and the fluorescent layers, and a dielectric layer is disposed between the address electrodes and the fluorescent layers.

12. A PDP, comprising:

a transparent front substrate;

a rear substrate disposed parallel to the front substrate;

an electromagnetic wave shielding layer fixed to the front substrate;

a plurality of front barrier ribs defining discharge cells, formed of a dielectric, and disposed between the front substrate and the rear substrate;

a plurality of front discharge electrodes and rear discharge electrodes disposed on the front barrier ribs so as to surround the discharge cells;

a plurality of rear barrier ribs disposed between the front barrier ribs and the rear substrate;

a plurality of fluorescent layers disposed in a space defined by the rear barrier ribs; and a discharge gas filling the discharge cells;

wherein the electromagnetic wave shielding layer is covered by a planarizing layer.

13. The PDP of claim 12, wherein the electromagnetic wave shielding layer is fixed on a front surface of the front substrate.

14. The PDP of claim 13, wherein the electromagnetic wave shielding layer is formed on the front surface of the front substrate.

15. The PDP of claim 13, wherein the electromagnetic wave shielding layer is attached to the front surface of the front substrate using a dual-sided adhesive film.

16. The PDP of claim 12, wherein the electromagnetic wave shielding layer is fixed to a rear surface of the front substrate.

17. The PDP of claim 16, wherein the electromagnetic wave shielding layer is formed on the rear surface of the front substrate.

18. The PDP of claim 16, wherein the electromagnetic wave shielding layer is attached to the rear surface of the front substrate using a dual-sided adhesive film.

19. The PDP of claim 12, wherein the front barrier ribs and the rear barrier ribs are formed into a single body.

20. A PDP, comprising:

a transparent front substrate;

a rear substrate disposed parallel to the front substrate;

an electromagnetic wave shielding layer fixed to the front substrate;

a plurality of front barrier ribs defining discharge cells, formed of a dielectric, and disposed between the front substrate and the rear substrate;

a plurality of front discharge electrodes and rear discharge electrodes disposed on the front barrier ribs so as to surround the discharge cells;

a plurality of rear barrier ribs disposed between the front barrier ribs and the rear substrate;

a plurality of fluorescent layers disposed in a space defined by the rear barrier ribs;

a discharge gas filling the discharge cells; and a near infrared ray shielding layer fixed to the front substrate;

wherein the electromagnetic wave shielding layer is covered by the near infrared ray shielding layer.

* * * * *